United States Patent
Kamemoto et al.

(10) Patent No.: US 12,405,531 B2
(45) Date of Patent: Sep. 2, 2025

(54) ORGANIC EL DISPLAY DEVICE, PRODUCTION METHOD FOR CURED PRODUCT, AND PRODUCTION METHOD FOR ORGANIC EL DISPLAY DEVICE

(71) Applicant: TORAY INDUSTRIES, INC., Tokyo (JP)

(72) Inventors: Satoshi Kamemoto, Otsu (JP); Yusuke Komori, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 537 days.

(21) Appl. No.: 17/794,658

(22) PCT Filed: Feb. 8, 2021

(86) PCT No.: PCT/JP2021/004535
§ 371 (c)(1),
(2) Date: Jul. 22, 2022

(87) PCT Pub. No.: WO2021/171984
PCT Pub. Date: Sep. 2, 2021

(65) Prior Publication Data
US 2023/0098085 A1    Mar. 30, 2023

(30) Foreign Application Priority Data
Feb. 25, 2020   (JP) .................... 2020-029051

(51) Int. Cl.
*G03F 7/023*   (2006.01)
*G03F 7/039*   (2006.01)
(Continued)

(52) U.S. Cl.
CPC .......... *G03F 7/0233* (2013.01); *G03F 7/0392* (2013.01); *G03F 7/38* (2013.01);
(Continued)

(58) Field of Classification Search
CPC .. H10K 71/00; H10K 59/122; H10K 59/1201; H10K 59/124; H10K 71/40;
(Continued)

(56) References Cited

U.S. PATENT DOCUMENTS

2017/0293224 A1* 10/2017 Kamemoto ........... G03F 7/0233
2018/0019290 A1*  1/2018 Arai ........................ H05B 33/22
(Continued)

FOREIGN PATENT DOCUMENTS

| JP | 2007-16214 A | 1/2007 |
| WO | WO 2016/047483 A1 | 3/2016 |
| WO | WO 2018/021331 A1 | 2/2018 |

OTHER PUBLICATIONS

International Search Report, issued in PCT/JP2021/004535, PCT/ISA/210, dated Mar. 30, 2021.
(Continued)

*Primary Examiner* — Douglas W Owens
(74) *Attorney, Agent, or Firm* — Birch, Stewart, Kolasch & Birch, LLP

(57) ABSTRACT

An organic EL display device includes a cured product of a photosensitive resin composition containing: an alkali-soluble resin (A) and a naphthoquinone diazide sulfonic acid ester compound (B). The cured product exhibits an intensity ratio $I_{(S)}/I_{(TOTAL)}$ of 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product. The cured product suppresses the generation of sulfur gas since a reduced amount of sulfur atoms is present. A cured film of the product may be used as a planarization layer or pixel division layer in an organic EL display device.

11 Claims, 1 Drawing Sheet

(51) Int. Cl.
    *G03F 7/38*      (2006.01)
    *H10K 59/12*     (2023.01)
    *H10K 59/122*    (2023.01)
    *H10K 71/00*     (2023.01)
    *H10K 71/40*     (2023.01)

(52) U.S. Cl.
    CPC ........... *H10K 59/122* (2023.02); *H10K 71/00* (2023.02); *H10K 71/40* (2023.02); *H10K 59/1201* (2023.02)

(58) Field of Classification Search
    CPC ......... H10K 50/11; G03F 7/0392; G03F 7/38; G03F 7/0045; G03F 7/0233; G03F 7/004; G03F 7/022; G09F 9/00; G09F 9/30; H05B 33/10; H05B 33/12; H05B 33/22
    See application file for complete search history.

(56) References Cited

U.S. PATENT DOCUMENTS

| | | |
|---|---|---|
| 2019/0241716 A1 | 8/2019 | Komori et al. |
| 2020/0091265 A1* | 3/2020 | Matsuki ................. C09K 11/06 |

OTHER PUBLICATIONS

Written Opinion of the International Searching Authority, issued in PCT/JP2021/004535, PCT/ISA/237, dated Mar. 30, 2021.

\* cited by examiner

[Fig.1]
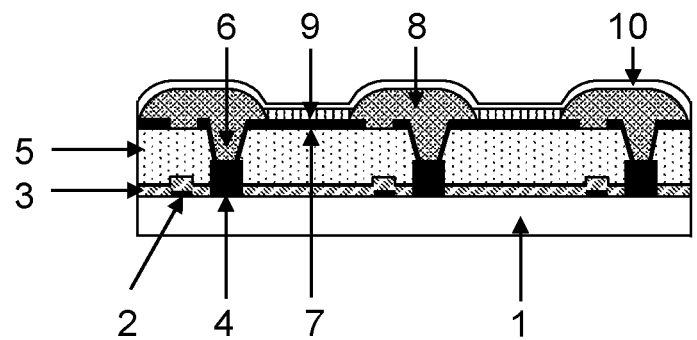
[Fig.2]
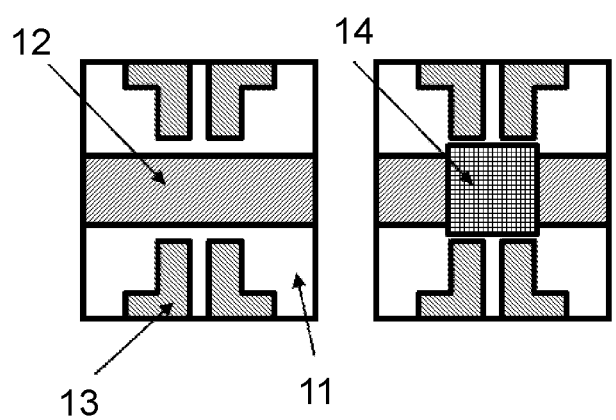
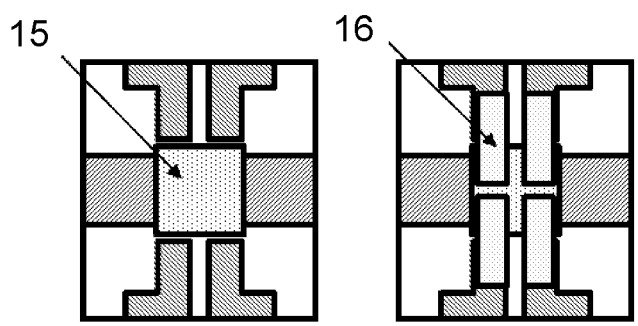

ORGANIC EL DISPLAY DEVICE, PRODUCTION METHOD FOR CURED PRODUCT, AND PRODUCTION METHOD FOR ORGANIC EL DISPLAY DEVICE

TECHNICAL FIELD

The present invention relates to an organic EL display device, a method for producing a cured product, and a method for producing an organic EL display device.

BACKGROUND ART

Many products that use organic electroluminescence (hereinafter, "organic EL") display devices have been developed in display devices including thin displays, such as smartphones, tablet PCs, and televisions.

In general, an organic EL display device has a drive circuit, a planarization layer, a first electrode, a pixel defining layer, an organic EL layer, and a second electrode that are placed over a substrate. The organic EL display device can emit light when a voltage is applied or an electric current is passed between the first electrode and the second electrode facing to each other. As a material for a planarization layer or a pixel defining layer among the above-described components, photosensitive resin compositions are generally used that can be patterned by irradiation of ultraviolet rays.

On the other hand, the demand for high reliability of organic EL display devices has become severer year by year, and materials for a planarization layer and materials for a pixel defining layer are also required to have a material that does not undergo a decrease in luminance and pixel shrinkage even after a reliability test under acceleration conditions such as high temperature, high humidity, and light irradiation. Pixel shrinkage is a phenomenon that the decrease in luminance occurs from edges of each pixel or lighting failure occurs.

The conventionally proposed positive-type photosensitive resin compositions include one in which a naphthoquinone diazide sulfonic acid ester compound (a photosensitive component) is mixed with an alkali-soluble resin and a polyimide precursor is used as a resin (see, for example, Patent Document 1) or a polybenzoxazole precursor is used as a resin (see, for example, Patent Document 2). Furthermore, it is also proposed to increase long-term reliability by keeping the sulfur concentration in the cured film within a certain range (see, for example, Patent Document 3).

PRIOR ART DOCUMENTS

Patent Documents

Patent Document 1: Japanese Patent Laid-open Publication No. 2002-91343
Patent Document 2: Japanese Patent Laid-open Publication No. 2002-116715
Patent Document 3: International Publication No. 2016-047483

SUMMARY OF THE INVENTION

Problems to be Solved by the Invention

However, it is difficult to say that the materials proposed in the above mentioned patent documents have sufficient performance in applications where the demand for high reliability is more severe, such as an in-vehicle display. In order to overcome the above-mentioned disadvantages, the present invention addresses the problem of providing an organic EL display device which does not undergo the decrease in luminance or pixel shrinkage and has excellent long-term reliability.

Solutions to the Problems

The present invention is an organic EL display device comprising a cured product of a photosensitive resin composition containing an alkali-soluble resin (A), a naphthoquinone diazide sulfonic acid ester compound (B), wherein an intensity ratio $I_{(S)}/I_{(TOTAL)}$ is 0.0001 or more and 0.008 or less, where $I(S)$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product.

Alternatively, the present invention is a method for producing a cured product of a photosensitive resin composition containing an alkali-soluble resin (A) and a naphthoquinone diazide sulfonic acid ester compound (B), the method comprising the successive steps of: applying the photosensitive resin composition to a substrate to form a photosensitive resin film; drying the photosensitive resin film; exposing the dried photosensitive resin film; developing the exposed photosensitive resin film; and heat-treating the developed photosensitive resin film to obtain a cured product, wherein an intensity ratio $I(S)/I_{(TOTAL)}$ is 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product.

Effects of the Invention

The organic EL display device of the present invention is one which does not undergo the decrease in luminance or pixel shrinkage and has excellent long-term reliability.

BRIEF DESCRIPTION OF THE DRAWINGS

FIG. 1 shows a cross-sectional view of a TFT substrate.
FIG. 2 shows a schematic configuration of a substrate of an organic EL display device.

EMBODIMENTS OF THE INVENTION

An embodiment of the present invention will be described in detail.

The organic EL display device according to an embodiment of the present invention is an organic EL display device having multiple pixels formed on a matrix. The driving system of the organic EL display device is roughly divided into a passive matrix type in which electrodes are divided into columns and rows and only pixels sandwiched between the electrodes emit light and an active matrix type in which several TFTs are provided in each pixel and switching is performed, but is not particularly limited. In the organic EL display device, a planarization layer, a first electrode, a pixel defining layer, an organic EL layer, and a second electrode are formed in this order on a substrate. An active matrix-type organic EL display device has, on a substrate such as glass, a TFT (thin film transistors) and a wiring line located at the lateral side of the TFT and connected to the TFT, and has a planarization layer on the driving circuit to cover recesses and protrusions, furthermore, with an organic EL element provided on the planarization layer. Each of the organic EL elements and each of the wiring lines are connected to each other through a contact hole formed in the planarization layer. In the organic EL display device according to the embodiment of the present invention, the pixel defining layer is formed on the first electrode.

FIG. 1 shows a cross-sectional view of an organic EL display device provided on a substrate 1. Bottom-gate-type or top-gate-type TFTs 2 are provided in lines on a substrate 1, and a TFT insulation layer 3 is formed so as to cover the TFTs 2. Wiring lines 4 respectively connected to the TFTs 2 are provided beneath the TFT insulation layer 3. Contact holes 7 for opening the wiring lines 4 and a planarization layer 5 are provided on the TFT insulation layer 3, wherein the planarization layer 5 are provided in such a manner that the contact holes 7 are embedded in the planarization layer 5. Opening sections are provided in the planarization layer 5 so as to respectively reach the contact holes 6 for the wiring lines 4. Further, a first electrode 7 is formed on the planarization layer 5 to be connected to the wiring lines 4 through the contact holes 6. Further, a pixel defining layer 8 is formed so as to cover the peripheral edge of the first electrode 7. Furthermore, the organic EL layer 9 and the second electrode 10 are formed thereon. This organic EL display device may be a top emission-type device where emitted light is emitted from the side opposite to the substrate 1, or may be a bottom emission-type device where light is extracted from the substrate 1 side.

A display in which organic EL elements each having an emission peak wavelength in a red wavelength region, organic EL elements each having an emission peak wavelength in a green wavelength region and organic EL elements each having an emission peak wavelength in a blue wavelength region are arranged on this substrate or a display in which white-color organic EL elements are formed on the whole surface thereof and is used in combination with a color filter is called "a color display", wherein it is common that the peak wavelength of displayed red region light is in the range from 560 to 700 nm, the peak wavelength of displayed green region light is in the range from 500 to 560 nm and the peak wavelength of displayed blue region light is in the range from 420 to 500 nm.

The area that is called "a luminescent pixel" is an area in which a first electrode and a second electrode, which are placed opposite to each other, intersect with each other and overlap with each other and an area which is defined by the pixel defining layer on the first electrode. In an active matrix-type display, an area in which a switching means is formed is arranged so as to occupy a part of the luminescent pixel, wherein the luminescent pixel may have a partially missing shape rather than a rectangular shape. However, the shape of the luminescent pixel is not limited to the above-mentioned shapes. The shape of the luminescent pixel may also be a circular shape, and may be altered readily depending on the shape of the pixel defining layer.

In the manufacture of the organic EL element of the present invention, an organic EL layer is formed by a mask deposition method. A mask deposition method is a method in which an organic compound is deposited using a deposition mask to form a pattern, wherein the deposition is carried out while placing a deposition mask having a desired patter as an opening section on the deposition source side of the substrate. In order to produce a high-precision deposition pattern, it is important to closely adhere a deposition mask having high flatness onto a substrate. In this case, a technique in which a tension is applied to the deposition mask, a technique in which a deposition mask is closely adhered onto a substrate with a magnet that is placed on the back surface of the substrate or the like is generally employed.

Examples of the method for producing the deposition mask include an etching method, mechanical grinding, a sandblast method, a sintering method, a laser processing method, the utilization of a photosensitive resin and the like. In the case where a fine pattern is required, an etching method and an electrocasting method each capable of achieving excellent processing precision are commonly employed.

The configuration of the organic EL layer contained in the organic EL element of the present invention is not particularly limited, and may be any one of the following configurations: (1) a hole-transport layer/a light-emitting layer; (2) a hole-transport layer/a light-emitting layer/an electron transport layer; and (3) a light-emitting layer/an electron transport layer.

Subsequently, a second electrode is formed. In an active matrix type, the second electrode is often formed solidly over the whole area of the light-emitting area. The second electrode is required to have a function of a negative electrode, i.e., a function of injecting electrons efficiently. Therefore, a metallic material is usually used for the second electrode, from the viewpoint of the stability of the electrode. Alternatively, it is also possible to utilize the first electrode as a negative electrode and utilize the second electrode as a positive electrode.

After the formation of the second electrode, sealing is carried out to produce an organic EL display device. In general, an organic EL element is believed to be sensitive to moisture. Therefore, in order to produce a display device having high reliability, it is preferred to carry out the sealing under an atmosphere having smaller oxygen and moisture concentrations as possible. With respect to the member to be used for the sealing, it is preferred to select a member having a high gas barrier property.

An organic EL display device of the present invention is an organic EL display device comprising a cured product of a photosensitive resin composition containing an alkali-soluble resin (A) and a naphthoquinone diazide sulfonic acid ester compound (B), wherein an intensity ratio $I_{(S)}/I_{(TOTAL)}$ is 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product.

As a result of intensive studies, the present inventors have found that a sulfur atom contained in the cured film is a factor that lowers the long-term reliability of the organic EL device. More specifically, the present inventors have identified that a sulfur component in the planarization layer or the pixel defining layer is gasified and leaked into the inside of the pixel, thereby causing a phenomenon called pixel shrinkage, which is a phenomenon that the decrease in luminance occurs from edges of each pixel or lighting failure occurs. The pixel defining layer is in contact with an edge of a pixel, and a sulfur component gasified during a long-term reliability test leaks into the pixel, thereby causing pixel shrinkage. In addition, the planarization layer is not in contact with the edge of a pixel, but the sulfur component gasified during the long-term reliability test moves to the inside of the pixel defining layer through the region in contact with the pixel defining layer, and further leaks into the pixel, thereby causing pixel shrinkage.

In order to solve the problem, an intensity ratio $I_{(S)}/I_{(TOTAL)}$ is 0.008 or less, preferably 0.006 or less, more preferably 0.005 or less, still more preferably 0.004 or less, and particularly preferably 0.003 or less, where $I_{(S)}$ is a negative secondary ion intensity of sulfur, and $I_{(TOTAL)}$ is a sum total of negative secondary ion intensities of carbon, oxygen, fluorine, silicon and sulfur obtained by time-of-flight secondary ion mass spectrometry of the cured product, whereby a decrease luminance and pixel shrinkage do not occur, and it is possible to provide sufficient long-term reliability as an organic EL display device. The intensity ratio $I_{(S)}/I_{(TOTAL)}$ is preferably 0.0001 or more, and more preferably 0.0005 or more.

Here, in order to obtain a cured product having an $I_{(S)}/I_{(TOTAL)}$ of 0.008 or less, sulfur dioxide may be removed to the outside of the cured product by carbon-sulfur bond cleavage of the naphthoquinone diazide sulfonic acid ester compound (B) in the heat treatment step, and the amount of sulfur atoms contained in the cured product may be reduced.

Specific examples of a method for obtaining a cured product having $I_{(S)}/I_{(TOTAL)}$ of 0.008 or less include the following.

[Method 1]

A method in which in a photosensitive resin composition containing an alkali-soluble resin (A) and a naphthoquinone diazide sulfonic acid ester compound (B), a naphthoquinone diazide-4-sulfonic acid ester compound (B1) is contained as the naphthoquinone diazide sulfonic acid ester compound (B), and when a cured product of the photosensitive resin composition is produced, a step of irradiating the developed photosensitive resin film with ultraviolet rays is performed between the step of developing the exposed photosensitive resin film and the step of heat-treating the developed photosensitive resin film to obtain the cured product, and the maximum heating temperature in the step of obtaining a cured product by the heat treatment is 400° C. or more.

[Method 2]

A method in which in a photosensitive resin composition containing an alkali-soluble resin (A) and a naphthoquinone diazide sulfonic acid ester compound (B), only a naphthoquinone diazide-5-sulfonic acid ester compound is contained as the naphthoquinone diazide sulfonic acid ester compound (B), and a base generator (C) is further contained, and when a cured product of the photosensitive resin composition is produced, the maximum heating temperature in the step of obtaining a cured product by heat treatment is 400° C. or more.

[Method 3]

A method in which in a photosensitive resin composition containing an alkali-soluble resin (A) and a naphthoquinone diazide sulfonic acid ester compound (B), a naphthoquinone diazide-4-sulfonic acid ester compound (B1) is contained as the naphthoquinone diazide sulfonic acid ester compound (B), and a base generator (C) is further contained, and when a cured product of the photosensitive resin composition is produced, the maximum heating temperature in the step of obtaining a cured product by heat treatment is 230° C. or more.

In any of the methods of Method 1 to 3 described above, sulfur dioxide can be removed to the outside of the cured product by carbon-sulfur bond cleavage of the naphthoquinone diazide sulfonic acid ester compound (B) in the heat treatment step, and the amount of sulfur atoms contained in the cured product can be reduced. Among them, the method 3 is most preferable in that the heat treatment temperature is relatively low and the influence of thermal degradation of the TFT element can be avoided.

The organic EL display device of the present invention includes at least a substrate, a first electrode, a second electrode, an organic EL layer, a planarization layer, and a pixel defining layer, and the cured product is preferably included in the planarization layer and/or the pixel defining layer. When the planarization layer and/or the pixel defining layer contains the cured product, it is possible to provide an organic EL display device having very excellent long-term reliability.

Here, the time-of-flight secondary ion mass spectrometry of the cured product will be described in detail.

The time-of-flight secondary ion mass spectrometry is commonly referred to as Time-Of-Flight Secondary Ion Spectrometry (TOF-SIMS). TOF-SIMS is an analysis method in which a surface of a solid sample is irradiated with pulsed primary ions in high vacuum, and secondary ions released from the solid are mass-separated using a velocity distribution corresponding to mass, that is, light ions are separated at a high velocity and heavy ions are separated at a low velocity. The mass spectrum of the outermost surface of the sample is obtained by measuring the time-of-flight distribution. The mass spectrum in the depth direction can be obtained by performing TOF-SIMS analysis while performing sputtering in the depth direction using a sputtering ion gun in combination with the TOF-SIMS analysis.

Next, analysis points of the cured product will be described. $I_{(S)}$ is a negative secondary ion intensity of sulfur, and $I_{(TOTAL)}$ is a sum total of negative secondary ion intensities of carbon, oxygen, fluorine, silicon and sulfur obtained by time-of-flight secondary ion mass spectrometry of the cured product, which means mass spectrum information obtained by performing TOF-SIMS analysis at a point of 500 nm from the surface of the cured product in a direction from the surface toward the inside of the cured product. The film thickness of the planarization layer and the pixel defining layer of the organic EL display device is generally in the range of 1000 to 5000 nm, and the point of 500 nm from the surface of the cured product substantially means that the central region inside the cured product is analyzed. When the cured product is included in the planarization layer and/or the pixel defining layer of the organic EL display element, it is preferable to perform TOF-SIMS analysis on a surface part of the cured product in a region 2 μm or more away from the contact hole edge or the pixel opening edge in the planar direction. A region of 2 μm or less in the planar direction from the contact hole edge or the pixel opening edge may have a film thickness of 500 nm or less, and in this case, mass spectrum information of a lower layer component other than the inside of the cured product may be mixed.

Information on the direction from the surface toward the inside of the cured product obtained by TOF-SIMS analysis is usually obtained by converting the sputtering time into the distance in the direction from the surface to the inside of the object. Examples of the method of converting the sputtering time into the distance in the direction from the surface to the inside of the object include a method of converting the time into the distance from the relationship between the film thickness of the cured product measured in advance and the sputtering time from the surface to the inside of the cured product, and a method in which profile acquisition is interrupted during TOF-SIMS analysis of the cured material and the distance from the surface to the interior of the analytical crater obtained is measured with a sensing pin-type film thickness meter to calculate the sputtering rate in the cured material in advance. The method for measuring the film thickness of the cured product is not particularly limited. For example, the film thickness can be measured by electron microscope observation of the cross section of the resin cured product.

When the composition is not uniform, such as when the film component has a distribution in the film depth direction, the sputtering rate, that is, the film thickness sputtered per unit time is not accurately constant, but in the present invention, it is not necessary to accurately specify the point of 500 nm from the surface of the cured product, and thus there is no problem in the above-described determination method.

For example, when a cured product provided in an organic EL display device is analyzed using the TOF-SIMS, it is necessary to expose the surface of the cured product. Hereinafter, an example of a method for exposing the surface of the cured product will be described, but the exposure method is not limited to the following.

As a method for exposing the surface of the cured product, for example, by using a sputtering gun such as argon, cesium, oxygen, or gallium, the upper part of the surface of the intended cured product can be removed to expose the surface of the cured product.

Alternatively, as an exposure method using chemical etching, the surface of the cured product can be exposed by a method in which both or one of the electrodes sandwiched between the upper and lower sides of the pixel defining layer is dissolved with an acid or an alkali to form a gap between the upper and lower sides of the cured product, and the laminated body is delaminated.

Furthermore, as an exposure method using the oblique cutting method, the cover glass of the organic EL display device is removed, and the exposed laminated body including the organic EL layer, the pixel defining layer, and the like is collectively cut obliquely with respect to the light extraction direction, whereby the surface of the cured product can be exposed.

Next, a cured product of a photosensitive resin composition containing an alkali-soluble resin (A) and a naphthoquinone diazide sulfonic acid ester compound (B) will be described.

The photosensitive resin composition contains an alkali-soluble resin (A). The alkali solubility refers to allowing the dissolution rate determined from a reduction in film thickness in the case of applying a solution of the resin dissolved in γ-butyrolactone onto a silicon wafer, forming a prebaked film of 10 μm±0.5 μm in film thickness by pre-baking for 4 minutes at 120° C., immersing the prebaked film in a 2.38% by mass tetramethylammonium hydroxide aqueous solution at 23±1° C. for 1 minute, and then subjecting the film to a rinse treatment with pure water, to be 50 nm/minute or more.

Examples of the alkali-soluble resin (A) include, but are not limited to, polyimide, a polyimide precursor, polybenzoxazole, a polybenzoxazole precursor, polyaminoamide, an acrylic resin, a cardo polymer, a phenol resin, a cyclic olefin polymer, and a siloxane resin. Two or more of these resins may be contained. Among these alkali-soluble resins, those having the excellent heat resistance and a small amount of outgas at a high temperature are preferable. Specifically, one or more kinds of alkali-soluble resins selected from the group consisting of polyimide, a polyimide precursor, polybenzoxazole, a polybenzoxazole precursor, a copolymer thereof, and polysiloxane are preferable. In addition, one or more kinds of alkali-soluble resins selected from the group consisting of a polyimide, a polyimide precursor, a polybenzoxazole, a polybenzoxazole precursor, and a copolymer thereof are still more preferable from the viewpoint of excellent film properties such as bending resistance.

One or more kinds of alkali-soluble resins selected from the group consisting of a polyimide, a polyimide precursor, a polybenzoxazole, a polybenzoxazole precursor, and a copolymer thereof that can be used as the alkali-soluble resin (A) preferably have an acidic group in the structural unit of the resin and/or at the main chain terminal thereof in order to impart the alkali solubility. Examples of the acidic group include a carboxyl group, a phenolic hydroxy group and a sulfonic acid group. Among these acidic groups, a carboxyl group and a phenolic hydroxy group are preferred, because no sulfur atom is contained in each of the groups. It is also preferred that the alkali-soluble resin (A) has a fluorine atom. In this case, it becomes possible to impart water repellency to an interface between the film and a base material during the development with an aqueous alkali solution, thereby preventing the penetration of the aqueous alkali solution into the interface. The fluorine atom content in the alkali-soluble resin is preferably 5% by mass or more from the viewpoint of the effect of preventing the alkali aqueous solution from permeating the interface, and is preferably 20% by mass or less in terms of solubility in the alkali aqueous solution.

The alkali-soluble resin (A) is synthesized by a publicly known method. In the case of a polyamic acid or a polyamic acid ester, for example, the amide group- and/or imide group-containing alkali-soluble resin can be synthesized by a method of reacting a tetracarboxylic dianhydride with a diamine compound at low temperature, a method in which a tetracarboxylic acid dianhydride and a diamine compound are reacted at a low temperature, and then the amide acid structure is partially esterified with N,N-dimethylformamide dimethyl acetal or the like, a method of obtaining a diester from a tetracarboxylic dianhydride and an alcohol, and then reacting the diester in the presence of an amine and a condensing agent, or a method of obtaining a diester from a tetracarboxylic dianhydride and an alcohol, then converting the remaining dicarboxylic acid to an acid chloride, and reacting the acid chloride with an amine.

As for a polyimide, for example, it can be produced by dehydrating and ring-closing the polyamic acid or the polyamic acid ester produced by the above-mentioned method, with means of heating in a solvent or chemical treatment with acid, base, or the like.

In the case of the polybenzoxazole precursor, the precursor can be obtained by, as a production method thereof, allowing a bisaminophenol compound and a dicarboxylic acid to undergo a condensation reaction. Specifically, examples of the production method include a method of allowing a dehydration condensation agent such as dicyclohexylcarbodiimide (DCC) and an acid to undergo a reaction and adding a bisaminophenol compound thereto, and a method of adding a solution of a dicarboxylic acid dichloride dropwise into a solution of a bisaminophenol compound with a tertiary amine such as pyridine added thereto.

The polybenzoxazole can be obtained, for example, by dehydrating and cyclizing a polybenzoxazole precursor obtained by the above-described method by heating in a solvent or chemical treatment with an acid, a base, or the like.

Specific examples of the acid dianhydride used as the polyimide, the polyimide precursor, and the copolymer thereof include pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, and aliphatic tetracarboxylic dianhydrides such as butanetetracarboxylic dianhydride and 1,2,3,4-cyclopentanetetracarboxylic dianhydride. Two or more of them may be used.

Examples of the acid component used as the polybenzoxazole, the polybenzoxazole precursor, and the copolymer thereof include dicarboxylic acids such as terephthalic acid, isophthalic acid, diphenyl ether dicarboxylic acid, bis(carboxyphenyl)hexafluoropropane, biphenyldicarboxylic acid, benzophenone dicarboxylic acid, and triphenyldicarboxylic acid, tricarboxylic acids such as trimellitic acid, trimesic acid, diphenyl ether tricarboxylic acid, and biphenyltricarboxylic acid, and tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid, and aliphatic tetracarboxylic acids such as butane tetracarboxylic acid and 1,2,3,4-cyclopentanetetracarboxylic acid. Two or more of them may be used.

Specific examples of the diamine include 3,4'-diaminodiphenyl ether, 4,4'-diaminodiphenyl ether, 3,4'-diaminodiphenylmethane, 4,4'-diaminodiphenylmethane, 1,4-bis(4-aminophenoxy)benzene, benzidine, m-phenylenediamine, p-phenylenediamine, 1,5-naphthalenediamine, 2,6-naphthalenediamine, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, a compound in which at least some of the hydrogen atoms in these aromatic rings are substituted with an alkyl group or a halogen atom, aliphatic cyclohexyldiamine, aliphatic methylenebiscyclohexylamine, and diamines having the structure shown below. Two or more of them may be used.

[Chemical formula 1]

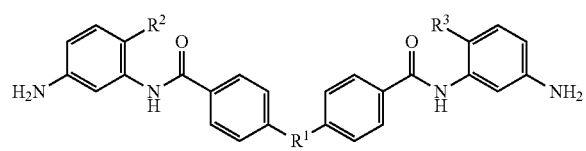

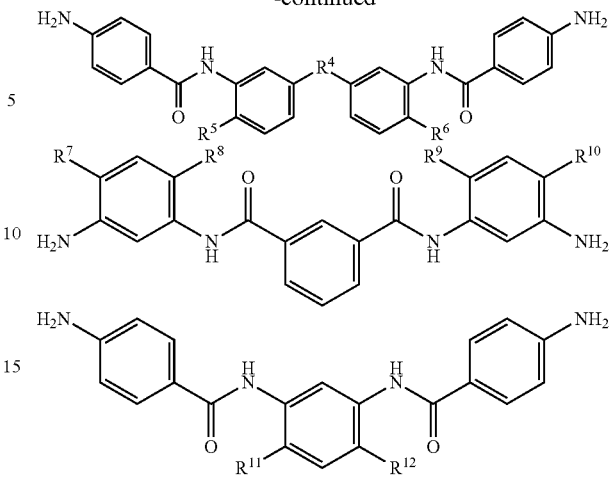

$R^1$ and $R^4$ represents an oxygen atom, $C(CF_3)_2$, or $C(CH_3)_2$. $R^2$, $R^3$, and $R^5$ to $R^{12}$ each independently represent a hydrogen atom or a hydroxyl group.

These diamines can be used as diamines, as corresponding diisocyanate compounds, or as corresponding trimethylsilylated diamines.

Furthermore, by blocking the terminal of these resins with a monoamine having a publicly known acidic group, with an acid anhydride, with an acid chloride, or with a monocarboxylic acid, a resin having an acidic group at the main chain terminal can be obtained.

The content of the terminal blocking agents such as the monoamines, acid anhydrides, acid chlorides, and monocarboxylic acids described above is preferably 2 to 25 mol % based on 100 mol % of the total acid and amine components constituting the resin.

As the acrylic resin, a resin obtained by radically polymerizing a (meth)acrylic acid or a (meth)acrylic acid ester is preferable. As the (meth)acrylic acid ester, a publicly known (meth)acrylic acid ester such as methyl (meth)acrylate, ethyl (meth)acrylate, propyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, 2-(4-methoxycyclohexyl)oxycarbonylethyl (meth)acrylate, norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, or 1-methyladamantyl (meth)acrylate is used. It is possible to copolymerize an aromatic vinyl compound such as styrene, p-methylstyrene, o-methylstyrene, m-methylstyrene, or α-methylstyrene with the (meth)acrylic acid or (meth)acrylic acid ester.

An ethylenically unsaturated double bond group can be introduced by addition reaction of an epoxy compound having an ethylenically unsaturated double bond group to (meth)acrylic acid.

Examples of the cardo resin include a resin having a cardo structure, that is, a skeleton structure in which two cyclic structures are bonded to a quaternary carbon atom constituting a cyclic structure. A common cardo structure is a fluorene ring bonded to a benzene ring.

Specific examples of the skeleton structure in which two cyclic structures are bonded to a quaternary carbon atom constituting a cyclic structure include a fluorene skeleton, a bisphenol fluorene skeleton, a bisaminophenyl fluorene skeleton, a fluorene skeleton having an epoxy group, and a fluorene skeleton having an acrylic group.

The cardo resin is formed by polymerizing a skeleton having the cardo structure by, for example, a reaction between functional groups bonded to the skeletons. The cardo resin has a structure in which a main chain and a bulky side chain are connected by one element (cardo structure), and has a cyclic structure in a direction substantially perpendicular to the main chain.

Specific examples of the monomer having a cardo structure include publicly known substances such as bisphenols containing a cardo structure such as bis(glycidyloxyphenyl) fluorene type epoxy resin, 9,9-bis(4-hydroxyphenyl)fluorene, and 9,9-bis(4-hydroxy-3-methylphenyl)fluorene, 9,9-bis(cyanoalkyl)fluorenes such as 9,9-bis(cyanomethyl) fluorene, and 9,9-bis(aminoalkyl)fluorenes such as 9,9-bis (3-aminopropyl)fluorene.

The cardoresin is a polymer obtained by polymerizing a monomer having a cardo structure, but may be a copolymer with another copolymerizable monomer.

Examples of the phenol resin include publicly known phenol resins such as a novolac phenol resin and a resol phenol resin, and the phenol resin is obtained by polycondensation of various phenols alone or a mixture of a plurality of phenols thereof with an aldehyde such as formalin.

Examples of the phenols constituting the novolac phenol resin and the resol phenol resin include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis p-cresol, resorcin, catechol, 2-methylresorcin, 4-methylresorcin, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, and β-naphthol, and these can be used alone or as a mixture of two or more.

In addition to formalin, examples of aldehydes include paraformaldehyde, acetaldehyde, benzaldehyde, hydroxybenzaldehyde, and chloroacetaldehyde, which can be used alone or as a mixture of two or more.

The preferred weight average molecular weight of the phenol resin used in the present invention is within a range of 2000 to 50000, preferably a range of 3000 to 30000 in terms of polystyrene using gel permeation chromatography. When the weight average molecular weight exceeds 50000, developability and sensitivity tend to deteriorate, and when the weight average molecular weight is less than 2000, pattern shape, resolution, developability, and heat resistance tend to deteriorate.

Examples of the polysiloxane include publicly known polysiloxanes obtained by hydrolysis and dehydration condensation of one or more selected from a tetrafunctional organosilane, a trifunctional organosilane, a bifunctional organosilane, and a monofunctional organosilane.

Specific examples of the organosilane include tetrafunctional silanes such as tetramethoxysilane, tetraethoxysilane, tetraacetoxysilane, and tetraphenoxysilane, methyltrimethoxysilane, methyltriethoxysilane, ethyltrimethoxysilane, ethyltriethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, trimethoxysilane, 3,3,3-trifluoropropyltrimethoxysilane, 3-aminopropyltrimethoxysilane, 3-aminopropyltrimethoxys, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy] propyltrimethoxysilane, [(3-ethyl-3-oxetanyl)methoxy]propyltriethoxysilane, 3-mercaptopropyltrimethoxysilane, 3-trimethoxysilylpropylsuccinic acid, 1-naphthyltrimethoxysilane, 1-naphthyltriethoxysilane, 1-naphthyltri-n-propoxysilane, 2-naphthyltrimethoxysilane, trifunctional silanes such as dimethyldimethoxysilane, dimethyldiethoxysilane, dimethyldiacetoxysilane, din-butyldimethoxysilane, diphenyldimethoxysilane, (3-glycidoxypropyl)methyldimethoxysilane, bifunctional silanes such as (3-glycidoxypropyl) methyldiethoxysilane, di(1-naphthyl)dimethoxysilane, and di(1-naphthyl)diethoxysilane; and monofunctional silanes such as trimethylmethoxysilane, tri n-butylethoxysilane, (3-glycidoxypropyl)dimethylmethoxysilane, and (3-glycidoxypropyl)dimethylethoxysilane. Two or more of these organosilanes may be used. In addition, a silicate compound such as Methyl Silicate 51 manufactured by FUSO CHEMICAL CO., LTD., or M Silicate 51 manufactured by TAMA CHEMICAL CO., LTD., may be copolymerized.

The weight average molecular weight (Mw) of the polysiloxane is not particularly limited, but is preferably 1,000 or more in terms of polystyrene as measured by GPC (gel permeation chromatography) because coating film properties are improved. On the other hand, the weight average molecular weight is preferably 100,000 or less, more preferably 50,000 or less from the viewpoint of solubility in a developing solution.

The polysiloxane is synthesized by hydrolysis and partial condensation of monomers such as organosilanes. Here, the partial condensation does not mean condensation of all Si—OH of the hydrolysate, but means that a part of Si—OH remains in the resulting polysiloxane. General methods can be used for hydrolysis and partial condensation. Examples thereof include a method in which a solvent, water, and a catalyst as necessary are added to the organosilane mixture, and the mixture is heated and stirred at 50 to 150° C. for about 0.5 to 100 hours. During stirring, if necessary, a hydrolysis by-product (alcohols such as methanol) and a condensation by-product (water) may be distilled off by distillation.

The catalyst is not particularly limited, but an acid catalyst and a base catalyst are preferably used. Specific examples of the acid catalyst include hydrochloric acid, nitric acid, sulfuric acid, hydrofluoric acid, phosphoric acid, acetic acid, trifluoroacetic acid, formic acid, a polycarboxylic acid or an anhydride thereof, and an ion exchange resin. Specific examples of the base catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, alkoxysilane having an amino group, and an ion exchange resin.

The photosensitive resin composition contains a naphthoquinone diazide sulfonic acid ester compound (B). The naphthoquinone diazide sulfonic acid ester compound is preferably a compound in which a sulfonic acid of naphthoquinone diazide is bonded to a compound having a phenolic hydroxyl group by an ester.

A preferred example of the compound having a phenolic hydroxy group to be used is a compound in which naphthoquinone diazide-4-sulfonic acid or naphthoquinone diazide-5-sulfonic acid is introduced through an ester bond into a compound such as Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA and HML-TPHAP (product names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP and TM-BIP-A (product names, manufactured by Asashi Yukizai Corporation), 2,6-dimethoxymethyl-4-tert-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol and BisP-AP (a product name, manufactured by Honshu Chemical Industry Co., Ltd.). A compound other than the above-mentioned compound may also be used.

The naphthoquinone diazide sulfonic acid ester compound can be synthesized by an esterification reaction between a compound having a phenolic hydroxyl group and a quinone diazide sulfonic acid compound, and can be synthesized by a publicly known method. Use of such naphthoquinone diazide sulfonic acid ester compound further improves the resolution, sensitivity, and residual film ratio.

The naphthoquinone diazide sulfonic acid-4-ester compound has absorption in the i-line region of a mercury lamp and is suitable for i-line exposure, and the naphthoquinone diazide-5-sulfonic acid ester compound has absorption extending to the g-line region of a mercury lamp and is suitable for g-line exposure. In the present invention, both the naphthoquinone diazide-4-sulfonic acid ester compound and the naphthoquinone diazide-5-sulfonic acid ester compound can be used, and a naphthoquinone diazide sulfonic acid ester compound in which a naphthoquinone diazide-4-sulfonyl group and a naphthoquinone diazide-5-sulfonyl group are used in combination in the same molecule can be used, or a mixture of the naphthoquinone diazide-4-sulfonic acid ester compound and the naphthoquinone diazide-5-sulfonic acid ester compound can be used.

Among them, in the heat treatment step, the naphthoquinone diazide sulfonic acid ester compound is decomposed, and a part of the naphthoquinone diazide sulfonic acid ester compound becomes sulfur dioxide and is removed to the outside of the film. Therefore, the naphthoquinone diazide-4-sulfonic acid ester compound is preferable from the viewpoint that the amount of sulfur atoms contained in the cured product can be reduced. When the naphthoquinone diazide-4-sulfonic acid ester compound is used in combination with the base generator (C) described later, the decomposition of the naphthoquinone diazide sulfonic acid ester compound and the removal of sulfur dioxide to the outside of the film in the heat treatment step are remarkably promoted, so that the amount of sulfur atoms contained in the cured product can be further reduced. As a result, pixel shrinkage derived from a sulfur atom can be further suppressed, and thus, it is particularly preferably used.

The content of the naphthoquinone diazide-4-sulfonic acid ester compound (B1) is preferably in a range of 60% by mass or more and 100% by mass or less with respect to 100% by mass of the total amount of the naphthoquinone diazide sulfonic acid ester compound (B). When the content is 60% by mass or more, the amount of sulfur atoms contained in the cured product can be effectively reduced, and the content is more preferably 70% by mass or more, still more preferably 80% by mass or more.

The added amount of the naphthoquinone diazide sulfonic acid ester compound (B) is preferably 4% by mass or more, more preferably 5% by mass or more, still more preferably 6% by mass or more, and preferably 20% by mass or less, more preferably 15% by mass or less, still more preferably 10% by mass or less with respect to the total amount of the resin composition excluding the solvent. When the added amount is 4% by mass or more, a pattern can be formed with excellent sensitivity, and when the added amount is 20% by mass or less, pixel shrinkage derived from a sulfur atom of the naphthoquinone diazide sulfonic acid ester compound can be suppressed, and long-term reliability of the organic EL device can be enhanced.

The photosensitive resin composition preferably contains a base generator (C). The base generator (C) refers to a compound that generates a base such as an amine by heating. The temperature at which the base is generated is preferably 100° C. or more, more preferably 120° C. or more, still more preferably 140° C. or more from the viewpoint that the base is not generated in the step of heating and drying the photosensitive resin composition, and is preferably 240° C. or less, more preferably 220° C. or less, still more preferably 200° C. or less from the viewpoint that the base is sufficiently generated in the step of heat-treating after development. The base generator (C) is preferably a compound having a low degree of photolysis at an exposure wavelength. In the present invention, the exposure wavelength preferably includes any one of the wavelengths of i-line (365 nm), h-line (405 nm), and g-line (436 nm) of a mercury lamp, and a compound in which photolysis does not substantially occur by irradiation of these wavelengths is preferable. This makes it possible to suppress generation of a base from the hot base generator in the exposure treatment, so that it is possible to suppress a phenomenon in which an acid generated from the naphthoquinone diazide sulfonic acid ester compound (B) is deactivated by exposure.

By generating a base from the base generator (C) in the heat treatment step, decomposition of the naphthoquinone diazide sulfonic acid ester compound (B) and removal of sulfur dioxide to the outside of the film are promoted. The effect of removing sulfur dioxide to the outside of the film is particularly remarkable when a naphthoquinone diazide-4-sulfonic acid ester compound is used as the component (B). This is presumed to be because the carbon-sulfur bond energy of the naphthoquinone diazide-4-sulfonic acid ester compound is smaller than the carbon-sulfur bond energy of the naphthoquinone diazide-5-sulfonic acid ester compound, so that the naphthoquinone diazide-4-sulfonic acid ester compound is much more likely to cause the carbon-sulfur bond to be broken by the action of heat and a base during the heat treatment. Removal of sulfur oxide to the outside of the film is promoted in the heat treatment step, and as a result, pixel shrinkage derived from a sulfur atom can be further suppressed.

Examples of the base generated from the base generator (C) include a primary amine, a secondary amine, a tertiary amine, a quaternary ammonium, imidazole, pyrazole, guanidine, and biguanide. Among them, the base generator (C) is preferably a guanidine derivative and/or a biguanide derivative from the viewpoint of high basicity of the base generated from the base generator (C).

Specific examples of the base generator (C) include U-CAT (registered trademark) SA810, U-CAT SA831, U-CAT SA841, U-CAT SA851, U-CAT SA506, and U-CAT 5002 (The above trade names refer to products manufactured by San-Apro Ltd.), WPBG-165, WPBG-027, WPBG-082, WPBG-266, WPBG-300, WPBG-345 (The above trade names refer to products manufactured by FUJIFILM Wako Pure Chemical Corporation.), 2-(9-oxoxanthene-2-yl) propionicacid 1,5,7-triazabicyclo[4.4.0]deca-5-ene, 2-(9-oxoxanthene-2-yl) propionicacid 1,5, -diazabicyclo[4.3.0]nona-5-ene,2-(9-oxoxanthene-2-yl) propionicacid 1,8-diazabicyclo[5.4.0]undec-7-ene, [[(2-nitrobenzyl)oxy]carbonyl]cyclohexylamine, bis[[(2-nitrobenzyl)oxy]carbonyl]hexamethylenediamine, bis[[(α,α-dimethyl-3,5-dimethoxybenzyl)oxy]carbonyl]hexamethylenediamine, N-(isopropoxycarbonyl)-2,6-dimethylpiperidine, N-(tert-butoxycarbonyl)-2,6-dimethylpiperidine, N-(benzyloxycarbonyl)-2,6-dimethylpiperidine, N-tert-butoxycarbonyl-4-piperidylaceticacid, N-tert-butoxycarbonyl-piperidyl-4-carboxylicacid, N-tert-butoxycarbonyl-4-aminobenzoicacid, 4-(tert-butyloxycarbonyl-amino)cyclohexanone, 4-(tert-butyloxycarbonyl-amino) phenol, N-tert-butoxycarbonyl-tyramine, N-tert-butoxycarbonyldimethylpiperidine, N-(tert-butyloxycarbonyl)-prolinol, 1,3-bis(4-tert-butoxycarbonyl-aminophenoxy)benzene, 4,4'-bis(tert-butoxycarbonyl-amino)diphenylether, 3,4'-bis(tert-butoxycarbonyl-amino)diphenylether, N-phenyliminodiaceticacid, 1,2-bis(2-aminophenoxy) ethane-N,N,N',N'-4 aceticacid, N-methyl iminodiacetic acid, N-benzyliminodiaceticacid, 2-(9-oxoxanthene-2-yl) propionicacid 1,5,7-triazabicyclo[4.4.0]deca-5-ene, guanidinium 2-(3-benzoylphenyl) propionate and the like. These base generators may be used alone or in combination of two or more kinds thereof.

Among these base generators, examples of the guanidine derivative and/or the biguanide derivative include WPBG-266, WPBG-300, WPBG-345 (The above trade names refer to products manufactured by FUJIFILM Wako Pure Chemical Corporation), 2-(9-oxoxoxanthene-2-yl)propionicacid 1,5,7-triazabicyclo[4.4.0]dec-5-ene, 2-(9-oxoxanthene-2-yl)propionicacid 1,5, -diazabicyclo[4.3.0]nona-5-ene, 2-(9-oxoxoxanthene-2-yl)propionicacid 1,8-diazabicyclo[5.4.0]undec-7-ene, and the like.

The content of the base generator (C) is preferably 0.1% by mass or more, more preferably 1% by mass or more, still more preferably 2% by mass or more, and preferably 15% by mass or less, more preferably 10% by mass or less, still more preferably 5% by mass or less with respect to the total amount of the resin composition excluding the solvent. When the content is 0.1% by mass or more, pixel shrinkage derived from a sulfur atom of the naphthoquinone diazide sulfonic acid ester compound can be suppressed, the long-term reliability of the organic EL device can be enhanced, and when the content is 15% by mass or less, side effects such as deterioration of film physical properties can be suppressed.

The photosensitive resin composition preferably contains an organic solvent (D). As a result, the photosensitive resin composition can be prepared in the form of a varnish and therefore the coatability of the photosensitive resin composition can be improved.

The organic solvent such as polar aprotic solvents such as γ-butyrolactone, ethers such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, propylene glycol mono-n-propyl ether, dipropylene glycol monomethyl ether, dipropylene glycol monoethyl ether, dipropylene glycol mono-n-propyl ether, dipropylene glycol mono-n-butyl ether, tetrahydrofuran and dioxane, ketones such as acetone, methyl ethyl ketone, diisobutyl ketone, cyclohexanone, 2-heptanone, 3-heptanone and diacetone alcohol, esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate and ethyl lactate, other esters such as ethyl 2-hydroxy-2 methylpropionate, methyl 3-methoxypropionate, ethyl 3-methoxypropionate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, methyl acetoacetate and ethyl acetoacetate, aromatic hydrocarbons such as toluene and xylene, amides such as N-methylpyrrolidone, N,N-dimethylformamide and N,N-dimethylacetamide, and the like can be used alone or in combination.

The amount of the organic solvent used is not particularly limited, but is preferably 100 to 3000 mass %, and still more preferably 150 to 2000 mass % with respect to the total amount of the resin composition excluding the solvent. The proportion of the solvent having a boiling point of 180° C. or more to the total amount of the organic solvent is preferably 20% by mass or less, and still more preferably 10% by mass or less. By setting the proportion of the solvent having a boiling point of 180° C. or more to 30% by mass or less, the amount of outgas from the planarization layer or the insulation layer after heat curing can be suppressed to be low, and as a result, the long-term reliability of the organic EL device can be enhanced.

The photosensitive resin composition can contain a thermal crosslinking agent. The term "thermal crosslinking agent" refers to a compound having at least two thermally reactive functional groups, including an alkoxymethyl group, a methylol group, an epoxy group and an oxetanyl group, in the molecule. The thermal crosslinking agent is preferably contained, because the thermal crosslinking agent can cross-link the resin of component (A) and other additive components to improve the heat resistance, chemical resistance, and hardness of the film after heating curing, and can also reduce the amount of outgas generated from the cured product to improve the long-term reliability of the organic EL display device.

Two or more kinds of the thermal crosslinking agents may be used in combination.

The content of the thermal crosslinking agent is preferably 1% by mass or more and 30% by mass or less with respect to the total amount of the resin composition excluding the solvent. When the content of the thermal crosslinking agent is 1% by mass or more and 30% by mass or less inclusive, the chemical resistance and hardness of the film after the burning or curing can be improved, the amount of outgas generated from the cured product can be reduced to improve the long-term reliability of the organic EL display device, and the storage stability of the photosensitive resin composition can become superior.

The photosensitive resin composition used in the present invention can contain a colorant. The colorant refers to an organic pigment, an inorganic pigment, or a dye commonly used in the field of electronic information materials. The colorant is preferably an organic pigment and/or an inorganic pigment.

Examples of the organic pigment include diketopyrrolopyrrole-based pigments, azo-based pigments such as azo, disazo or polyazo, phthalocyanine-based pigments such as copper phthalocyanine, halogenated copper phthalocyanine, or metal-free phthalocyanine, anthraquinone-based pigments such as aminoanthraquinone, diaminodianthraquinone, anthrapyrimidine, flavanthrone, anthanthrone, indanthrone, pyranthrone, or violanthrone, quinacridone-based pigments, dioxazine-based pigments, perinone-based pigments, perylene-based pigments, thioindigo-based pigments, isoindoline-based pigments, isoindolinone-based pigments, quinophthalone-based pigments, threne-based pigments, benzofuranone-based pigments, or metal complex-based pigments.

Examples of the inorganic pigment include titanium oxide, zinc flower, zinc sulfide, lead white, calcium carbonate, precipitated barium sulfate, white carbon, alumina white, kaolin clay, talc, bentonite, black ferric oxide, cadmium red, red iron oxide, molybdenum red, molybdate orange, chrome vermillion, yellow lead, cadmium yellow, yellow ferric oxide, titanium yellow, chromium oxide, viridian, titanium cobalt green, cobalt green, cobalt chromium green, victoria green, ultramarine blue, Prussian blue, cobalt blue, cerulean blue, cobalt silica blue, cobalt zinc silica blue, manganese violet, or cobalt violet.

Examples of the dye include azo dyes, anthraquinone dyes, condensed polycyclic aromatic carbonyl dyes, indigoid dyes, carbonium dyes, phthalocyanine dyes, methine, or polymethine dyes.

For the purpose of improving the contrast of an organic EL display device, the color of the colorant is preferably a black color which can shield visible light over the entire wavelength range, and with the use of at least one or more selected from organic pigments, inorganic pigments, and dyes, such a colorant may be used which has a black color in the form of a cured film. To that end, the black organic pigment and black inorganic pigment described above may be used, or a pseudo black coloring may be obtained by mixing two or more organic pigments and dyes. In the case of pseudo black coloring, the coloring can be obtained by mixing two or more of the above-mentioned organic pigments such as red, orange, yellow, violet, blue, and green, and dyes. It is to be noted that there is not always a need for the photosensitive resin composition itself according to the present invention to be black in color, and such a colorant may be used which undergoes a color change at the time of curing by heating to cause the cured film to be black in color.

Among these colorants, from the viewpoint of being capable of ensuring high heat resistance, it is preferable to use such a colorant that contains an organic pigment and/or an inorganic pigment and has a black color in the form of a cured film. In addition, from the viewpoint of being capable of securing high insulation properties, it is preferable to use such a colorant that contains an organic pigment and/or a dye and has a black color in the form of a cured film. More specifically, from the viewpoint of being capable of achieving a balance between high heat resistance and insulation properties, it is preferable to use such a colorant that contains an organic pigment and has a black color in the form of a cured film.

The content of the colorant is preferably 5% by mass or more, more preferably 10% by mass or more, still more preferably 15% by mass or more, and preferably 50% by mass or less, more preferably 40% by mass or less, still more preferably 30% by mass or less with respect to the total amount of the resin composition excluding the solvent. The content of the colorant is adjusted to 5% by mass or more, thereby providing the colorability required for the cured film, and the content is adjusted to 30% by mass or less, thereby providing favorable storage stability.

When a pigment is used as the colorant in the photosensitive resin composition according to the present invention, a dispersant is preferably used in combination. Using the dispersant in combination allows the colorant to be uniformly and stably dispersed in the resin composition. The dispersant is not particularly limited, but a polymeric dispersant is preferred. Examples of the polymeric dispersant include a polyester-based polymeric dispersant, an acrylic based polymeric dispersant, a polyurethane-based polymeric dispersant, a polyallylamine-based polymeric dispersant, or a carbodiimide-based polymeric dispersant. More specifically, the polymeric dispersant refers to a polymer compound in which the main chain includes polyamino, polyether, polyester, polyurethane, polyacrylate, or the like, and the side chain or the main chain terminal has a polar groups such as amine, carboxylic acid, phosphoric acid, amine salt, carboxylate, phosphate. With the polar group adsorbed to the pigment, the steric hindrance of the main chain polymer serves to stabilize the pigment dispersion.

The dispersant is classified into a (polymer) dispersant that has only an amine number, a (polymer) dispersant that has only an acid number, a (polymer) dispersant that has an amine number and an acid number, or a (polymer) dispersant that has neither amine number nor an acid number, and the (polymer) dispersant that has an amine number and an acid number and the (polymer) dispersant that has only an amine number are preferred, and the (polymer) dispersant that has only an amine number is more preferred.

The proportion of the dispersant to the colorant is preferably 1% by mass or more, more preferably 3% by mass or more, in order to improve the dispersion stability while maintaining the heat resistance. Further, the proportion is preferably 100% by mass or less, more preferably 50% by mass or less.

The photosensitive resin composition used in the present invention can contain an adhesion promoter. Examples of the adhesion promoter include silane coupling agents such as vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, and N-phenyl-3-aminopropyltrimethoxysilane, titanium chelating agents, aluminum chelating agents, and compounds obtained by reacting an aromatic amine compound with an alkoxy group-containing silicon compound. Two or more of them may be contained. Containing the adhesion promoter allows, in such a case as developing a photosensitive resin film, the adhesion property thereof to a silicon wafer or an underlying base material made of ITO, SiO2, silicon nitride, or the like to be enhanced. Furthermore, it is possible to enhance the resistance to oxygen plasma and UV ozone treatment used for cleaning and the like. The content of the adhesion promoter is preferably 0.1 to 10% by weight relative to the total amount of the resin composition excluding the solvent.

If necessary, the photosensitive resin composition to be used in the present invention may contain a surfactant for the purpose of improving the wettability to a substrate. The surfactant can be a commercially available compound. Specific examples of the surfactant include silicone surfactants such as SH series, SD series, and ST series manufactured by Dow Corning Toray Silicone Company, Ltd., BYK series manufactured by BYK Japan KK, KP series manufactured by Shin-Etsu Silicone, DISFOAM series manufactured by NOF Corporation, and TSF series manufactured by Toshiba Silicone Co., Ltd., fluorine-containing surfactants such as "Megafac (registered trademark)" series manufactured by Dainippon Ink & Chemicals, Inc., FLUORAD series manufacture by Sumitomo 3M Limited, "SURFLON (registered trademark)" series and "AsahiGuard (registered trademark)" series manufactured by Asahi Glass Co., Ltd., EF series manufactured by Shin-Akita Kasei K. K., and PolyFox series manufactured by OMNOVA Solutions, and surfactants made from an acrylic and/or methacrylic polymer such as POLYFLOW series manufactured by KYOEISHA CHEMICAL Co., LTD., and "DISPARLON (registered trademark)" series manufactured by Kusumoto Chemicals, Ltd., but are not particularly limited thereto.

The content of the surfactant is preferably 0.001 to 1% by mass relative to the total amount of the resin composition excluding the solvent.

If necessary, the photosensitive resin composition to be used in the present invention may contain a compound having a phenolic hydroxy group for the purpose of compensating the alkaline developability of the photosensitive resin composition. Specific examples of the compound having a phenolic hydroxy group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCRIPZ, BisOCP-IPZ, BisOIPP-CP, Bis26X-IPZ, BisOTBP-CP, TekP-4HBPA (tetrakis P-DO-BPA), TrisPHAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X and BisRS-OCHP (product names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A (product names, manufactured by Asashi Yukizai Corporation), 1,4-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, 2,7-dihydroxynaphthalene, 2,4-dihydroxyquinoline, 2,6-dihydroxyquinoline, 2,3-dihydroxyquinoxaline, anthracene-1,2,10-triol, anthracene-1,8,9-triol and 8-quinolinol. When the compound having a phenolic hydroxy group is contained, the resultant photosensitive resin composition is very slightly soluble in an alkaline developing solution before exposure to light and can be dissolved readily in an alkaline developing solution after exposure to light. Therefore, the thickness loss caused by the development is reduced and the development can be carried out readily within a short time. As a result, the sensitivity can be improved readily.

The content of the compound having a phenolic hydroxy group is preferably 1% by mass or more and 20% by mass or less inclusive relative to the total amount of the resin composition excluding the solvent.

The photosensitive resin composition to be used in the present invention may additionally contain inorganic particles. Preferable specific examples include, but are not limited to, silicon oxide, titanium oxide, barium titanate, alumina and talc. The primary particle size of the inorganic particles is preferably 100 nm or less, more preferably 60 nm or less.

The content of the inorganic particles is preferably 5 to 90% by mass with respect to the total amount of the resin composition excluding the solvent.

The photosensitive resin composition to be used in the present invention may contain a thermal acid generator, as long as the long-term reliability of the organic EL display device cannot be deteriorated. The thermal acid generator generates an acid by being heated and accelerates the crosslinking reaction of the thermal crosslinking agent and also can accelerate the cyclization of the ring structures and thus further improve the mechanical characteristics of the cured film in a case in which the resin of component (A) has a non-closed imide ring structure and a non-closed oxazole ring structure.

The thermal decomposition initiation temperature of the thermal acid generator to be used in the present invention is preferably 50° C. to 270° C., more preferably 250° C. or less. In addition, it is preferable to select a thermal acid generator which does not generate an acid at the time of drying (prebaking: about 70° C. to 140° C.) after the photosensitive resin composition of the present invention is applied on a substrate but generates an acid at the time of final heating (curing: about 100° C. to 400° C.) after patterning is conducted by exposure and development subsequent to the drying since a decrease in sensitivity at the time of development can be suppressed.

The acid to be generated from the thermal acid generator to be used in the present invention is preferably a strong acid, for example, an arylsulfonic acid such as p-toluenesulfonic acid or benzenesulfonic acid, an alkyl sulfonic acid such as methanesulfonic acid, ethanesulfonic acid, propanesulfonic acid, or butanesulfonic acid, a haloalkylsulfonic acid such as trifluoromethylsulfonic acid, and the like are preferable. They are used as a salt such as an onium salt or as a covalent compound such as an imidosulfonate. Two or more of them may be contained.

The content of the thermal acid generator to be used in the present invention is preferably 0.01% by mass or more, more preferably 0.1% by mass or more, relative to the total amount of the resin composition excluding the solvent. When the thermal acid generator is contained in an amount of 0.01% by mass or more, the cross-linking reaction and the cyclization of the ring-unopened structure in the resin can be accelerated, resulting in the improvement in the mechanical characteristic and chemical resistance of the cured film. In addition, the content is preferably 5% by mass or less, more preferably 3% by mass or less, and still more preferably 2% by mass or less from the viewpoint of long-term reliability of the organic EL display device.

A method for producing a cured product of a photosensitive resin composition containing an alkali-soluble resin (A) and a naphthoquinone diazide sulfonic acid ester compound (B) of the present invention, the method comprises the successive steps of: applying the photosensitive resin composition to a substrate to form a photosensitive resin film; drying the photosensitive resin film; exposing the dried photosensitive resin film; developing the exposed photosensitive resin film; and heat-treating the developed photosensitive resin film to obtain a cured product, wherein an intensity ratio $I_{(S)}/I_{(TOTAL)}$ is 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product. In the method for producing a cured product, the maximum heating temperature in the step of obtaining a cured product by the heat treatment is preferably 250° C. or more and 400° C. or less. In addition, a step of irradiating the developed photosensitive resin film with ultraviolet rays is preferably included between the step of developing the photosensitive resin film and the step of heat-treating the photosensitive resin film to obtain a cured product.

Next, a step of applying the photosensitive resin composition to a substrate to form a photosensitive resin film will be described. The photosensitive resin composition is applied onto a substrate by a spin coating method, a slit coating method, a dip coating method, a spray coating method, a printing method or the like to produce a coating film of the photosensitive resin composition. Prior to the application, a base material to which the photosensitive resin composition is applied may be subjected to a pretreatment in advance with the above-described adhesion promoter. Examples of the pretreatment include a method of treating the base material surface with the use of a solution prepared by dissolving an adhesion promoter in a content of 0.5 to 20% by mass in a solvent such as isopropanol, ethanol, methanol, water, tetrahydrofuran, propylene glycol monomethyl ether acetate, propylene glycol monomethyl ether, ethyl lactate, or diethyl adipate. Examples of the method for treating the surface of the base material surface include a spin coating method, a slit die coating method, a bar coating method, a dip coating method, a spray coating method and a steam treatment.

The substrate can be selected from metal, glass, resin film, and the like that are desirable for supporting a display device and transporting it in the post-process. In the case of a glass substrate, a soda-lime glass, a non-alkali glass, or the like can be used, and the thickness may be sufficient to maintain the mechanical strength. As for the material of the glass, the non-alkali glass is preferable because less ions are eluted from the glass, but a soda-lime glass coated with a barrier coat such as $SiO_2$ is also commercially available, and thus this can be used. In the case of a resin film, the film containing a resin material selected from a polyimide, a polyamide, a polybenzoxazole, a polyamideimide, and a poly(p-xylylene) is preferable, and these resin materials may be contained alone or in combination of two or more thereof. For example, when the resin film is made of polyimide resin, it can also be formed by applying a solution containing polyamic acid (containing a partially imidized polyamic acid) which is a precursor of polyimide or soluble polyimide to a support substrate and burning the solution.

Next, the step of drying the photosensitive resin film will be described.

After the application, the coating film may be optionally subjected to a reduced-pressure drying treatment, and is then subjected to a heating treatment at 50° C. to 180° C. for 1 minute to several hours using a hot plate, an oven, infrared ray or the like to produce a photosensitive resin film.

Next, the step of exposing the dried photosensitive resin film will be described.

The photosensitive resin film is irradiated with actinic rays through the mask which has a desired pattern. Examples of the actinic ray used for the exposure include ultraviolet rays, visible rays, electron rays, and X-rays, and in the present invention, i-line (365 nm), h-line (405 nm), or g-line (436 nm) from a mercury lamp is preferably used.

Next, the step of developing the exposed photosensitive resin film will be described.

After the exposure to light, an exposed area is removed using a developing solution. The developing solution is preferably an aqueous solution of a compound having alkaline properties, such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine. If required, a polar solvent (e.g., N-methyl-2-pyrrolidone, N,N-dimethylformamide, N,N-dimethylacetamide, dimethyl sulfoxide, γ-butyrolactone and dimethylacrylamide), an alcohol (e.g., methanol, ethanol and isopropanol), an ester (e.g., ethyl lactate, propylene glycol monomethyl ether acetate), a ketone (e.g., cyclopentanone, cyclohexanone, isobutyl ketone and methyl isobutyl ketone) may be added singly or in the form of a combination of two or more of them to the alkaline aqueous solution. As the developing method, a method of a spray mode, a paddle mode, a dip mode, an ultrasonic mode and the like can be employed.

Subsequently, it is preferred that the patter formed by the development is rinsed with distilled water.

If necessary, an alcohol (e.g., ethanol, isopropyl alcohol), an ester (e.g., ethyl lactate, propylene glycol monomethyl ether acetate) or the like may be added to distilled water for the rising treatment.

Next, the step of irradiating the developed photosensitive resin film with ultraviolet rays will be described.

The naphthoquinone diazide sulfonic acid ester compound (B) is changed to an indene carboxylic acid compound by irradiation of ultraviolet rays. In the indene carboxylic acid compound, the removal of sulfur dioxide derived from the sulfonic acid ester structure to the outside of the film is further promoted in the heat treatment step described later. Therefore, the sulfur concentration in the cured product can be further reduced, and the long-term reliability of the organic EL device can be further enhanced. Here, the ultraviolet rays preferably include any one of the wavelengths of i-line (365 nm), h-line (405 nm), and g-line (436 nm) of a mercury lamp, and an irradiation dose is preferably in a range of 100 to 10000 $mJ/cm^2$. The naphthoquinone diazide sulfonic acid ester compound can be efficiently changed to an indene carboxylic acid compound by treatment at these wavelengths and the irradiation dose.

Next, a step of heat-treating the developed photosensitive resin film to obtain a cured product will be described.

When the heat treatment is carried out, a remaining solvent or a component having low heat resistance can be removed, resulting in the improvement in heat resistance and chemical resistance. In particular, when the alkali-soluble resin (A) contained in the photosensitive resin composition of the present invention contains a polyimide precursor, a polybenzoxazole precursor, or a copolymer thereof, an imide ring or an oxazole ring can be formed by heat treatment, and therefore heat resistance and chemical resistance can be improved, and when a thermal crosslinking agent is contained, a thermal crosslinking reaction can be allowed to proceed by heat treatment, and heat resistance and chemical resistance can be improved. Furthermore, when the base generator (C) is contained, a base is generated by heat treatment, and sulfur dioxide derived from the sulfonic acid ester structure of the naphthoquinone diazide sulfonic acid ester compound (B) can be removed outside the film.

In the heat treatment, the temperature may be raised stepwise and then maintained at the maximum heating temperature, or may be raised continuously and then maintained at the maximum heating temperature, or may be maintained at the maximum heating temperature from the beginning. Here, the maximum heating temperature refers to the highest temperature in which the temperature range in which the resin film experiences the temperature or higher for a cumulative total of 1 minute or longer is confirmed among a temperature the resin film experiences as a result of heating. The maximum heating temperature is preferably 240° C. or more, more preferably 250° C. or more, still more preferably 260° C. or more from the viewpoint of sufficiently proceeding the reaction of removing sulfur dioxide derived from the sulfonic acid ester structure of the naphthoquinone diazide sulfonic acid ester compound (B) to the outside of the film. The temperature is preferably 420° C. or less, more preferably 400° C. or less, still more preferably 350° C. or less, and particularly preferably 320° C. or less from the viewpoint of avoiding the influence of thermal degradation of the TFT element. The retention time at the maximum heating temperature is not particularly limited, but is preferably 15 minutes or more, more preferably 30 minutes or more, still more preferably 45 minutes or more from the viewpoint of sufficiently proceeding the reaction of removing sulfur dioxide derived from the sulfonic acid ester structure of the naphthoquinone diazide sulfonic acid ester compound (B) to the outside of the film. The retention time is preferably 180 minutes or less, more preferably 150 minutes or less, still more preferably 120 minutes or less from the viewpoint of productivity.

Next, a method for producing the organic EL display device will be described.

In a method for producing an organic EL display device including a step of forming a planarization layer, a first electrode, a pixel defining layer, an organic EL layer, and a second electrode in this order on a substrate, a method for producing a cured product contained in the planarization layer and/or the pixel defining layer is a method for producing a cured product, the method comprising the successive steps of: applying the photosensitive resin composition containing an alkali-soluble resin (A) and a naphthoquinone diazide sulfonic acid ester compound (B) to a substrate to form a photosensitive resin film; drying the photosensitive resin film; exposing the dried photosensitive resin film; developing the exposed photosensitive resin film; and heat-treating the developed photosensitive resin film to obtain a cured product, wherein an intensity ratio $I_{(S)}/I_{(TOTAL)}$ is preferably 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product.

In the method for producing a cured product, the maximum heating temperature in the step of obtaining a cured product by the heat treatment is preferably 250° C. or more and 400° C. or less.

In addition, a step of irradiating the photosensitive resin film with ultraviolet rays is preferably included between the step of developing the photosensitive resin film and the step of heat-treating the photosensitive resin film. The ultraviolet rays preferably include a light having any one of the wavelengths of i-line (365 nm), h-line (405 nm), and g-line (436 nm) of a mercury lamp, and an irradiation dose is preferably in a range of 100 to 10000 mJ/cm$^2$. The naphthoquinone diazide sulfonic acid ester compound can be efficiently changed to an indene carboxylic acid compound by treatment at these wavelengths and the irradiation dose.

EXAMPLES

Hereinbelow, the present invention will be described by way of examples and others. However, the present invention is not limited by these examples. The evaluation of photosensitive resin compositions and the organic EL display device in Examples were carried out with the following methods.

(1) Sensitivity Evaluation

Calculation of Exposure Sensitivity

The photosensitive resin composition obtained in each of Examples and Comparative Examples was applied to an 8-inch silicon wafer with a spin coating method using a coating/development apparatus ACT-8 (manufactured by Tokyo Electron Ltd.), and the resulting product was baked on a hot plate at 120° C. for 3 minutes to prepare a prebaked film having a film thickness of 3.0 μm. The film thickness was measured under the condition of a refractive index of 1.63 using Lambda Ace STM-602 manufactured by Dainippon Screen Mfg. Co., Ltd. Subsequently, the prebaked film was exposed to light using an exposure system i-line stepper NSR-2005i9C (manufactured by Nikon Corporation) through a mask having a 10-μm contact hole pattern at an exposure amount of 100 to 700 mJ/cm$^2$ in 10 mJ/cm$^2$ steps. After the exposure to light, the exposed film was developed with a 2.38% by mass aqueous tetramethyl ammonium solution (abbreviated as "TMAH", hereinafter, manufactured by Tama Chemicals Co., Ltd.) using the development apparatus ACT-8 for a time necessary to achieve a thickness loss of 0.5 μm in the development, and the developed product was rinsed with distilled water and then dried by shaking off to produce a pattern.

The obtained pattern of the developed film was observed with a FDP microscope MX61 (manufactured by Olympus Corporation) at a magnification of 20×, the minimum necessary exposure amount at which the opening diameter of the contact hole reached 10 μm was determined, and the value of the minimum necessary exposure amount was defined as exposure sensitivity.

(2) TOF-SIMS Analysis of Cured Product

<Production of Cured Product>

The schematic configuration of the substrate used above is shown in FIG. 2. First, an ITO transparent conductive film having a thickness of 100 nm was formed on the whole surface of a 38×46 mm non-alkali glass substrate 11 by a sputtering method, and was then etched to form a first electrode 12. Simultaneously, an auxiliary electrode 13 was also formed for taking out a second electrode. The substrate was washed with ultrasonic waves for 10 minutes using "Semico Clean 56" (a product name, manufactured by Furuuchi Chemical Corporation), and was then washed with ultra-pure water. Subsequently, each of photosensitive resin compositions (varnishes) according to each of Examples and Comparative Examples described later was applied onto the whole surface of the substrate by a spin coating method, and was then prebaked on a hot plate at 120° C. for 2 minutes. The film was exposed to UV light through a photomask using a parallel light mask aligner (hereinafter referred to as PLA) (PLA-501F manufactured by Canon Inc.) and an ultra-high-pressure mercury vapor lamp as the light source (a mixed line of g line, h line, and i line), and then developed with a 2.38% TMAH aqueous solution to dissolve only the exposed parts, and rinsed with pure water. In Examples and Comparative Examples described as "With bleach after development" in Tables 1 to 4, the entire surface was exposed at an exposure amount of 500 mJ/cm² using PLA-501F. The obtained patterned substrate was cured in an oven under a nitrogen atmosphere at a temperature described in each of Examples and Comparative Examples for 60 minutes using an inert oven (CLH-21CD-S manufactured by Koyo Thermo Systems Co., Ltd.). In this way, opening sections of 50 μm in width and 260 μm in length were arranged at a pitch of 155 μm in the width direction and a pitch of 465 μm in the length direction, and a pixel defining layer 14 in a shape for exposing the first electrode through the respective opening sections was formed only on a substrate effective area in a limited fashion. In this manner, a pixel defining layer having an opening ratio of 18% was provided on a substrate active area that had a 16 mm-square tetragonal shape, and the thickness of the pixel defining layer was about 2.0 μm.

<Detection of Negative Secondary Ion by TOF-SIMS Depth Direction Analysis>

For the cured product part of the obtained substrate with a pixel defining layer, TOF-SIMS depth direction analysis was performed using the following apparatus, and a secondary ion generated at the time of TOF-SIMS depth direction analysis was measured.

Apparatus: TOF. SIMS5 (manufactured by ION-TOF Company)
Etching ion species: Cs+
Etching ion acceleration energy: 2 keV
Primary ion: Bi⁺
Primary ion energy: 25 keV
Current value of primary ion: 0.4 pA
Secondary ion polarity: Negative
Measurement area: 10 μm square
Measurement mode: High mass resolution
Antistatic: Irradiation with electron beam from flood gun (electron gun)
Mass number of carbon negative secondary ion: 12
Mass number of oxygen negative secondary ion: 16
Mass number of fluorine negative secondary ion: 19
Mass number of silicon negative secondary ion: 28
Mass number of sulfur negative secondary ion: 32

In mass spectrum information obtained by performing TOF-SIMS analysis at a point of 500 nm from the film surface in the film depth direction of the cured product, the negative secondary ion intensity of sulfur is $I_{(S)}$ (unit: counts), and the sum total of the negative secondary ion intensities of carbon, oxygen, fluorine, silicon and sulfur is $I_{(TOTAL)}$ (unit: counts). The point of 500 nm from the film surface was obtained by a method of converting time into distance from the relationship between the film thickness of the cured film measured in advance and the sputtering time from the cured product surface to the cured product bottom surface.

(3) Test of Long-Term Reliability of Organic EL Display Device

<Production of Organic EL Display Device>

An organic EL display device was produced using a substrate having, formed thereon, a first electrode, an auxiliary electrode and a pixel defining layer in the same manner as in section (2). A nitrogen plasma treatment was carried out as a pretreatment, and then an organic EL layer 15 was formed by a vacuum deposition method. The vacuum degree during the deposition process was $1 \times 10^{-3}$ Pa or less, and the substrate was rotated relative to a deposition source during the deposition process. First, a compound (HT-1) was deposited as a hole injection layer in a thickness of 10 nm, and a compound (HT-2) was deposited as a hole transporting layer in a thickness of 50 nm. Next, on the light-emitting layer, a compound (GH-1) as a host material and a compound (GD-1) as a dopant material were deposited in a thickness of 40 nm so that the doping concentration was 10%. Next, a compound (ET-1) and a compound (LiQ) as electron transporting materials were stacked at a volume ratio of 1:1 to a thickness of 40 nm. The structures of the compounds used in the organic EL layer are as follows.

[Chemical formula 2]

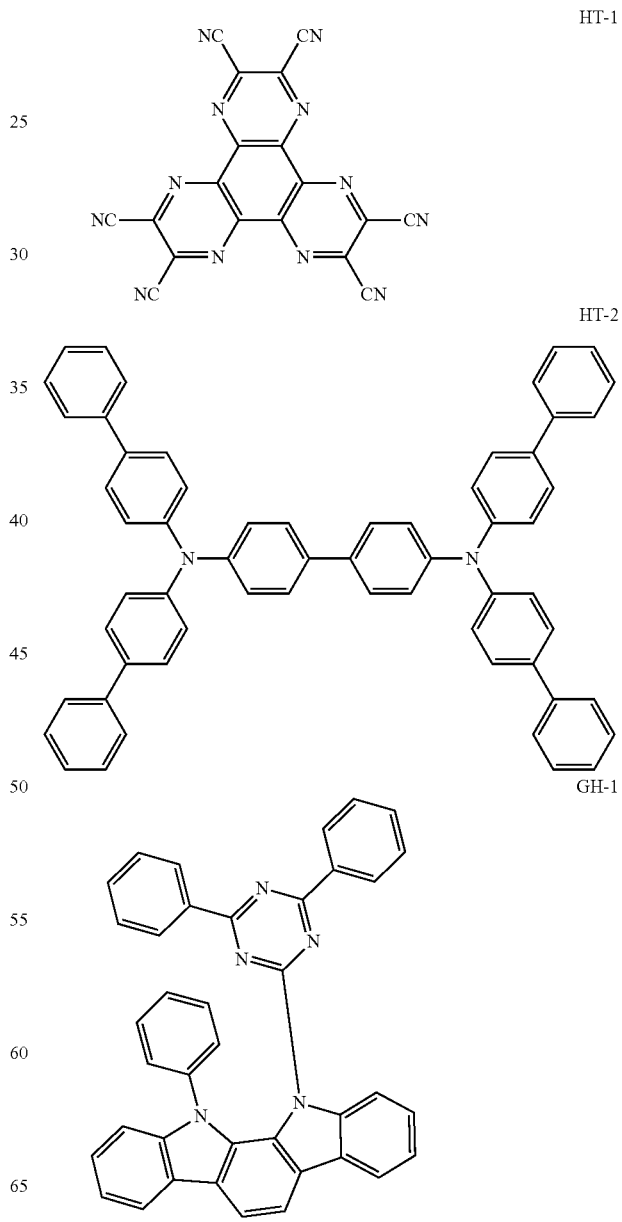

GO-1

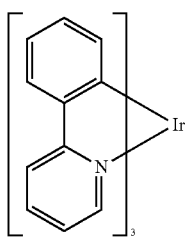

LiQ

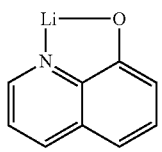

ET-1

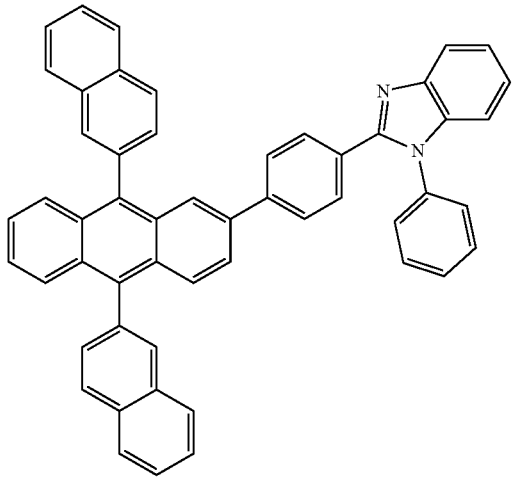

Subsequently, the compound (LiQ) was deposited at a thickness of 2 nm, and then Mg and Ag were deposited at a thickness of 60 nm at a volume ratio of 10:1 to produce a second electrode 16. Finally, the resultant product was sealed by bonding a cap-shaped glass plate using an epoxy resin-type adhesive agent under a low-moisture nitrogen atmosphere. In this manner, four light-emitting devices each having a 5 mm-square tetragonal shape were produced on a single substrate. The term "film thickness" as used herein refers to a displayed value on a quartz oscillation-type film thickness monitor.

<Evaluation of Long-Term Reliability>

The prepared organic EL display device was placed in a xenon test apparatus (Q-SUN manufactured by Q-Lab Corporation), and subjected to UV irradiation treatment at an illuminance of 800 W/m² and a temperature of 50° C. The organic EL display device was taken out every 50 hours, and emitted at 10 mA/cm² by direct current drive, and the emission area in the luminescent pixel was measured. When the initial emission area before the UV irradiation treatment test was set to 100, the minimum time for which the emission area after the UV irradiation treatment test was 50 or less was defined as the organic EL display device reliability (unit: hr), and the organic EL display device reliability was judged according to the following criteria, and the organic EL display device reliability of 300 hr or more was regarded as acceptable.

A+: Reliability of 650 hr or more
A: Reliability of 600 hr
A−: Reliability of 550 hr
B+: Reliability of 500 hr
B: Reliability of 450 hr
B−: Reliability of 400 hr
C: Reliability of 350 hr
D: Reliability of 300 hr
E: Reliability of 200 to 250 hr
F: Reliability of 100 to 150 hr
G: Not evaluable.

Synthesis Example 1 Synthesis of Hydroxyl Group-Containing Diamine Compound 2,2-bis(3-amino-4-hydroxypheny)hexafluoropropane (hereinafter, referred to as BAHF) (18.3 g, 0.05 mol) was dissolved in 100 mL of acetone and 17.4 g of propylene oxide (0.3 mol) and the mixture was cooled to −15° C. A solution prepared by dissolving 3-nitrobenzoyl chloride (20.4 g (0.11 mol)) in acetone (100 mL) was added dropwise to the cooled solution. After completion of dropping, the mixture was reacted at −15° C. for 4 hours, and then the temperature was returned to room temperature. The precipitated white solid was separated by filtration and vacuum-dried at 50° C.

The solid (30 g) was placed in a 300 mL stainless autoclave and then dispersed in methyl cellosolve (250 mL), and 5% palladium-carbon (2 g) was added to the solution. With hydrogen introduced thereinto through a balloon, and the dispersion was allowed to undergo a reduction reaction at room temperature. After about 2 hours, it was confirmed that the balloon was no longer deflated, and the reaction was terminated. After the completion of the reaction, the solution was filtered to remove a catalyst, i.e., a palladium compound, and the filtrate was concentrated with a rotary evaporator to produce a hydroxyl group-containing diamine compound represented by the following formula.

[Chemical formula 3]

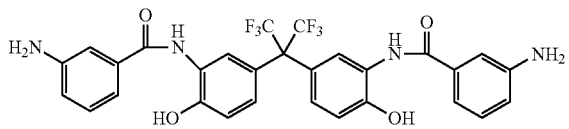

Synthesis Example 2 Synthesis of Polyimide Precursor (A-1)

Under a stream of dry nitrogen, 31.0 g (0.10 mol) of 3,3',4,4'-diphenyl ether tetracarboxylic acid dianhydride (hereinafter, referred to as ODPA) was dissolved in 500 g of NMP. The hydroxyl group-containing diamine compound (45.35 g (0.075 mol)) produced in Synthesis Example 1 and 1,3-bis(3-aminopropyl)tetramethyldisiloxane (1.24 g (0.005 mol)) were added together with NMP (50 g) to the solution, and the resultant mixture was reacted at 20° C. for 1 hour and was then further reacted at 50° C. for 2 hours. Subsequently, 4-aminophenol (4.36 g (0.04 mol)) that served as an end-capping agent was added together with NMP (5 g) to the reaction solution, and the resultant mixture was reacted at 50° C. for 2 hours. Then, a solution prepared by diluting 28.6 g (0.24 mol) of N,N-dimethylformamide dimethyl acetal with 50 g of NMP was added dropwise over 10 minutes. After the dropwise addition, the solution was stirred at 50° C. for 3 hours. After the completion of the stirring, the solution was cooled to room temperature and the solution was introduced into water (3 L) to produce white precipitates. The precipitates were collected by filtration, were then washed with water three times, and were then dried with a vacuum dryer at 80° C. for 24 hours to produce a polyimide precursor (A-1) which was a desired alkali-soluble resin.

Synthesis Example 3 Synthesis of Polyimide (A-2)

Under a dry nitrogen stream, 29.3 g (0.08 mol) of BAHF, 1.24 g (0.005 mol) of 1,3-bis(3-aminopropyl)tetramethyldisiloxane, and 3.27 g (0.03 mol) of 3-aminophenol as an end-capping agent were dissolved in 150 g of N-methyl-2-pyrrolidone (NMP). To this solution, 31.0 g (0.1 mol) of ODPA was added together with 50 g of NMP, and the solution was stirred for 1 hour at 20° C. and then stirred for 4 hours at 50° C. Subsequently, xylene (15 g) was added to the reaction solution, and the resultant mixture was stirred at 150° C. for 5 hours while azeotropically boiling water together with xylene. After completion of the stirring, the solution was poured into 3 L of water and a white precipitate was collected. This precipitate was collected by filtration, washed with water three times, and then dried in a vacuum dryer at 80° C. for 24 hours, thereby obtaining polyimide (A-2) which was an alkali-soluble resin.

Synthesis Example 4 Synthesis of Polybenzoxazole Precursor (A-3)

In a dry nitrogen stream, 18.3 g (0.05 mol) of BAHF was dissolved in 50 g of NMP and 26.4 g (0.3 mol) of glycidyl methyl ether, and the temperature of the solution was lowered to −15° C. A solution prepared by dissolving 7.4 g (0.025 mol) of diphenyl ether dicarboxylic acid dichloride (manufactured by NIPPON NOHYAKU CO., LTD.) and 5.1 g (0.025 mol) of isophthalic acid chloride (manufactured by TOKYO CHEMICAL INDUSTRY CO., LTD.) in 25 g of γ-butyrolactone (GBL) was added thereto dropwise so that the internal temperature did not exceed 0° C. After completion of the dropwise addition, stirring was continuously conducted at −15° C. for 6 hours. After the termination of the reaction, the solution was poured into 3 L of water containing 10% by mass of methanol to obtain a white precipitate, and the white precipitate was collected. This precipitate was collected by filtration, washed with water three times, and then dried in a vacuum dryer at 80° C. for 24 hours, thereby obtaining polybenzoxazole (PBO) precursor (A-3) which was an intended alkali-soluble resin.

Synthesis Example 5 Synthesis of Polysiloxane (A-4)

In a 500 ml three-necked flask, 44.86 g (0.200 mol) of p-styryltrimethoxysilane (St), 39.66 g (0.200 mol) of phenyltrimethoxysilane (Ph), 6.81 g (0.050 mol) of methyltrimethoxysilane (Me), 13.12 g (0.050 mol) of 3-trimethoxysilylpropylsuccinic anhydride (Suc), 0.522 g of TBC and 74.58 g of PGME were charged. While the resulting mixture was stirred at room temperature, an aqueous phosphoric acid solution prepared by dissolving 0.448 g (0.50 mass % with respect to the charged monomers) of phosphoric acid in 27.90 g of water was added over 30 minutes. Thereafter, the three-necked flask was immersed in an oil bath at 70° C. for 90 minutes with stirring, and then the temperature of the oil bath was raised to 115° C. over 30 minutes. The internal temperature (solution temperature) of the three-necked flask reached 100° C. after 1 hour from the start of temperature increase, and then the mixture was heated and stirred for 2 hours (internal temperature was 100 to 110° C.) to obtain a polysiloxane solution. During the temperature increase and heating/stirring, 0.05 litter/min of nitrogen was flowed. During the reaction, a total of 58.90 g of methanol and water as by-products were distilled out. PGME was added to the obtained polysiloxane solution so that the solid content concentration was 40% by mass to obtain a polysiloxane (A-4) solution.

Synthesis Example 6 Synthesis of Acrylic Resin (A-5)

In a 500 ml flask, 5 g of 2,2'-azobis(isobutyronitrile), 5 g of t-dodecanethiol, and 150 g of propylene glycol monomethyl ether acetate (hereinafter abbreviated as PGMEA) were placed. Thereafter, 30 g of methacrylic acid, 35 g of benzyl methacrylate, and 35 g of tricyclo[5.2.1.0$^{2,6}$]decan-8-yl methacrylate were added thereto, the mixture was stirred for a while at room temperature, the interior of the flask was purged with nitrogen, and the mixture was heated and stirred at 70° C. for 5 hours. Then, 15 g of glycidyl methacrylate, 1 g of dimethylbenzylamine, and 0.2 g of p-methoxyphenol were added to the resulting solution, and the resulting mixture was heated and stirred at 90° C. for 4 hours to produce an acrylic resin solution. PGMEA was added to the obtained acrylic resin solution so that the solid content concentration was 40% by mass to obtain an acrylic resin (A-5) solution.

Synthesis Example 7 Synthesis of Naphthoquinone Diazide-4-Sulfonic Acid Ester Compound (B-1)

Under a dried nitrogen stream, TrisP-PA (a product name, manufactured by Honshu Chemical Industry Co., Ltd.) (21.22 g (0.05 mol)) and naphthoquinone diazide-4-sulfonic acid chloride (36.27 g (0.135 mol)) were dissolved in 1,4-dioxane (450 g) and the temperature of the resultant solution was restored to room temperature. To this solution was added dropwise a mixture of 1,4-dioxane (50 g) and triethylamine (15.18 g) while avoiding the increase in temperature of the inside of the system to 35° C. or more. After the dropwise addition, the resultant mixture was stirred at 30° C. for 2 hours. A triethylamine salt was filtered out from the solution, and a filtrate was introduced into water. Subsequently, the precipitate was collected by filtration. The precipitate was dried in a vacuum dryer to obtain a 4-naphthoquinone diazide sulfonic acid ester compound (B-1) represented by the following formula.

[Chemical formula 4]

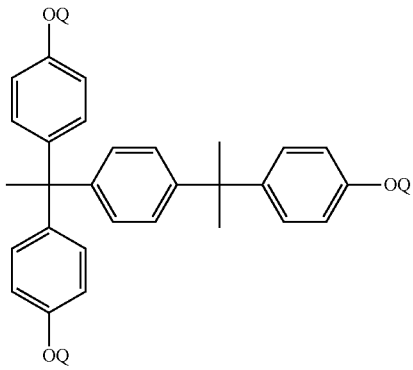

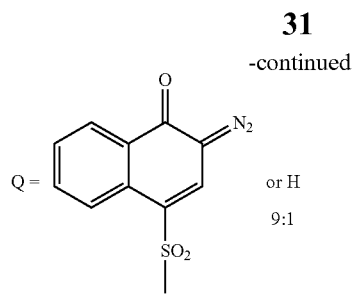

Synthesis Example 8 Synthesis of Naphthoquinone Diazide-5-Sulfonic Acid Ester Compound (B-2)

Under a dried nitrogen stream, TrisP-PA (a product name, manufactured by Honshu Chemical Industry Co., Ltd.) (21.22 g (0.05 mol)) and naphthoquinone diazide-5-sulfonic acid chloride (36.27 g (0.135 mol)) were dissolved in 1,4-dioxane (450 g) and the temperature of the resultant solution was restored to room temperature. To this solution was added dropwise a mixture of 1,4-dioxane (50 g) and triethylamine (15.18 g) while avoiding the increase in temperature of the inside of the system to 35° C. or more. After the dropwise addition, the resultant mixture was stirred at 30° C. for 2 hours. A triethylamine salt was filtered out from the solution, and a filtrate was introduced into water. Subsequently, the precipitate was collected by filtration. This precipitate was dried in a vacuum dryer to give a quinonediazide compound (B-2) represented by the following formula.

[Chemical formula 5]

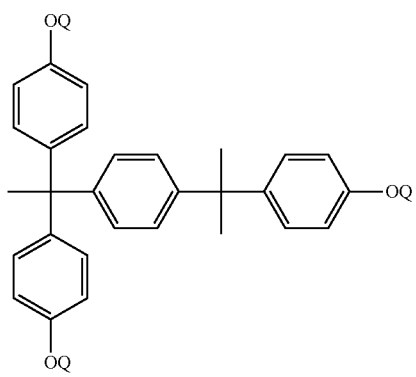

Base generators used in Examples and Comparative Examples are shown below.

C-1: WPBG-266 (manufactured by FUJIFILM Wako Pure Chemical Corporation), a compound having a biguanide structure in the molecule and having the following structure

[Chemical formula 6]

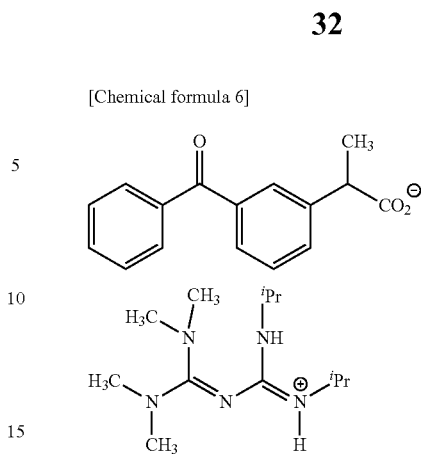

C-2: WPBG-300 (manufactured by FUJIFILM Wako Pure Chemical Corporation), a compound having a biguanide structure in the molecule and having the following structure

[Chemical formula 7]

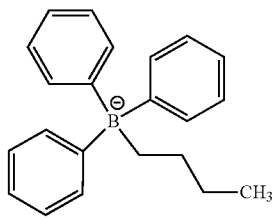

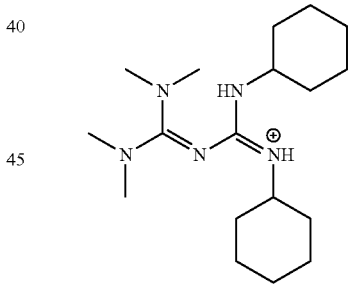

C-3: 4-(tert-butoxycarbonyl-amino) phenol

[Chemical formula 8]

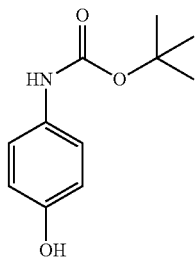

C-4: N-tert-butoxycarbonyl-2,6-dimethylpiperidine

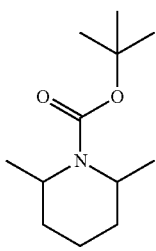

C-5: N-(tert-butoxycarbonyl)-prolinol

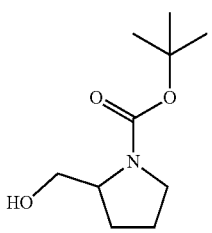

C-6: 1,3 bis(4-tert-butoxycarbonyl-aminophenoxy)benzene

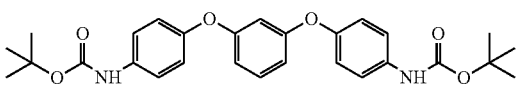

C-7: N-phenyliminodiacetic acid

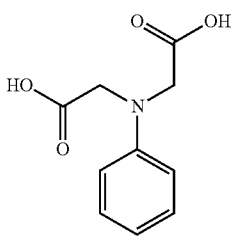

C-8: [[(2-Nitrobenzyl)oxy]carbonyl]cyclohexylamine

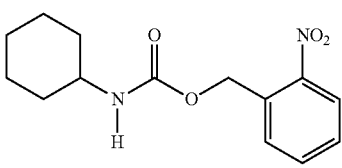

C-9: WPBG082 (manufactured by FUJIFILM Wako Pure Chemical Corporation), a compound having the following structure

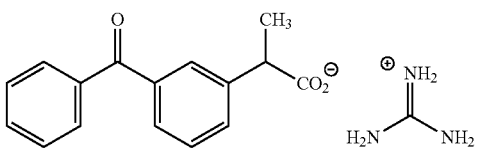

Example 1

The polyimide precursor (A-1) (10.0 g) synthesized in the Synthesis Example 2 above, 1.0 g of (B-1), and 0.5 g of (C-1) were dissolved in propylene glycol monomethyl ether (also referred to as "PGME", hereinafter) (40.0 g) and γ-butyrolactone (also referred to as "GBL", hereinafter) (10.0 g), and the resultant solution was filtrated through a 0.2-μm polytetrafluoroethylene-made filter (Sumitomo Electric Industries, Ltd.) to produce a photosensitive resin composition A.

Using the obtained photosensitive resin composition A, the exposure sensitivity was determined by the method described in <Calculation of exposure sensitivity>. A cured product was produced by the method described in <Production of cured product>, and the negative secondary ion intensity of sulfur: $I_{(S)}$ and the sum total of the negative secondary ion intensities of carbon, oxygen, fluorine, silicon and sulfur: $I_{(TOTAL)}$ were determined by the method described in <Detection of negative secondary ion by TOF-SIMS depth direction analysis>, and $I_{(S)}/I_{(TOTAL)}$ was calculated for the obtained cured product. Furthermore, an organic EL display device was produced by the method described in <Production of organic EL display device>, and the organic EL display device reliability was determined for the obtained organic EL display device by the method described in <Evaluation of long-term reliability>. The evaluation results are shown in Table 1.

Examples 2 to 25 and Comparative Examples 1 to 21

Varnishes B to Y and varnishes a to u were produced in the same manner as in Example 1 using the compounds of which the types and amounts are shown in Tables 1 to 5. In addition, the exposure sensitivity, $I_{(S)}/I_{(TOTAL)}$, and the reliability of the organic EL display device were determined in the same manner as in Example 1. The evaluation results are shown in Tables 1 to 5.

The results of long-term reliability test of organic EL display device Each of Examples 1 to 25 which is organic EL display devices is organic EL display devices comprising a cured product of a photosensitive resin composition containing an alkali-soluble resin (A) and a naphthoquinone diazide sulfonic acid ester compound (B), wherein an intensity ratio $I_{(S)}/I_{(TOTAL)}$ is 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product. The devices according to Examples 1 to 25 have extremely good long-term reliability compared to the devices in Comparative Examples 1 to 21 not satisfying the above conditions. In Comparative Example 3, not only the exposed part but also the non-exposed part was dissolved during development, and a desired pattern could not be obtained. Therefore, TOF-SIMS depth direction analysis and a long-term reliability test could not be performed.

TABLE 1

|  |  | Examples | | | | | |
| --- | --- | --- | --- | --- | --- | --- | --- |
|  |  | 1 | 2 | 3 | 4 | 5 | 6 |
| Photosensitive resin composition |  | A | B | C | D | E | F |
| Composition of photosensitive resin composition [parts by mass] | A-1 (Polyimide precursor) | 100 | 100 | 100 |  |  |  |
|  | A-2 (Polyimide) |  |  |  | 100 |  |  |
|  | A-3 (PBO precursor) |  |  |  |  | 100 |  |
|  | A-4 (Polysiloxane) |  |  |  |  |  | 100 |
|  | A-5 (Acrylic resin) |  |  |  |  |  |  |
|  | B-1 | 10 | 15 | 20 | 10 | 10 | 10 |
|  | B-2 |  |  |  |  |  |  |
|  | C-1 | 5 | 5 | 5 | 5 | 5 | 5 |
|  | C-2 |  |  |  |  |  |  |
|  | C-3 |  |  |  |  |  |  |
|  | C-4 |  |  |  |  |  |  |
|  | PGME | 400 | 400 | 400 | 400 | 400 | 400 |
|  | PGMEA |  |  |  |  |  |  |
|  | GBL | 100 | 100 | 100 | 100 | 100 | 100 |
| Processing Conditions | Bleaching treatment after development | With | With | With | With | With | With |
|  | Heat treatment temperature [° C.] | 270 | 270 | 270 | 270 | 270 | 270 |
| Evaluation results | Exposure sensitivity [mJ/cm$^2$] | 180 | 150 | 120 | 280 | 220 | 150 |
|  | $I_{(s)}/I_{(TOTAL)}$ | 0.0020 | 0.0027 | 0.0035 | 0.0022 | 0.0023 | 0.0042 |
|  | Organic EL display device reliability [hr] | 500 | 450 | 400 | 500 | 500 | 400 |
|  | Evaluation | B+ | B | B− | B+ | B+ | B− |

|  |  | Examples | | | |
| --- | --- | --- | --- | --- | --- |
|  |  | 7 | 8 | 9 | 10 |
| Photosensitive resin composition |  | G | H | I | J |
| Composition of photosensitive resin composition [parts by mass] | A-1 (Polyimide precursor) |  | 100 | 100 | 100 |
|  | A-2 (Polyimide) |  |  |  |  |
|  | A-3 (PBO precursor) |  |  |  |  |
|  | A-4 (Polysiloxane) |  |  |  |  |
|  | A-5 (Acrylic resin) | 100 |  |  |  |
|  | B-1 | 10 | 10 | 10 | 10 |
|  | B-2 |  |  |  |  |
|  | C-1 | 5 |  |  |  |
|  | C-2 |  | 5 |  |  |
|  | C-3 |  |  | 5 |  |
|  | C-4 |  |  |  | 5 |
|  | PGME |  | 400 | 400 | 400 |
|  | PGMEA | 400 |  |  |  |
|  | GBL | 100 | 100 | 100 | 100 |
| Processing Conditions | Bleaching treatment after development | With | With | With | With |
|  | Heat treatment temperature [° C.] | 270 | 270 | 270 | 270 |
| Evaluation results | Exposure sensitivity [mJ/cm$^2$] | 350 | 180 | 180 | 180 |
|  | $I_{(s)}/I_{(TOTAL)}$ | 0.0057 | 0.0020 | 0.0027 | 0.0038 |
|  | Organic EL display device reliability [hr] | 300 | 500 | 450 | 400 |
|  | Evaluation | D | B+ | B | B− |

TABLE 2

|  |  | Examples | | | | | |
| --- | --- | --- | --- | --- | --- | --- | --- |
|  |  | 11 | 12 | 13 | 14 | 15 | 16 |
| Photosensitive resin composition |  | K | L | M | N | O | P |
| Composition of photosensitive resin composition | A-1 (Polyimide precursor) | 100 | 100 | 100 | 100 | 100 | 100 |
|  | A-2 (Polyimide) |  |  |  |  |  |  |
|  | A-3 (PBO precursor) |  |  |  |  |  |  |

TABLE 2-continued

| [parts by mass] | | | | | | | |
|---|---|---|---|---|---|---|---|
| | A-4 (Polysiloxane) | | | | | | |
| | A-5 (Acrylic resin) | | | | | | |
| | B-1 | 10 | 10 | 10 | 10 | 10 | 10 |
| | B-2 | | | | | | |
| | C-1 | 5 | 5 | 5 | 5 | 5 | 5 |
| | C-2 | | | | | | |
| | C-3 | | | | | | |
| | C-4 | | | | | | |
| | PGME | 400 | 400 | 400 | 400 | 400 | 400 |
| | PGMEA | | | | | | |
| | GBL | 100 | 100 | 100 | 100 | 100 | 100 |
| Processing Conditions | Bleaching treatment after development | With | With | With | With | With | With |
| | Heat treatment temperature [° C.] | 240 | 250 | 260 | 300 | 350 | 400 |
| Evaluation results | Exposure sensitivity [mJ/cm$^2$] | 180 | 180 | 180 | 180 | 180 | 180 |
| | $I_{(s)}/I_{(TOTAL)}$ | 0.0048 | 0.0027 | 0.0023 | 0.0015 | 0.0010 | 0.0009 |
| | Organic EL display device reliability [hr] | 350 | 450 | 500 | 600 | 700 | 700 |
| | Evaluation | C | B | B+ | A | A+ | A+ |

| | | | 17 | 18 | 19 | 20 |
|---|---|---|---|---|---|---|
| | Photosensitive resin composition | | Q | R | S | T |
| Composition of photosensitive resin composition [parts by mass] | A-1 (Polyimide precursor) | | 100 | 100 | 100 | 100 |
| | A-2 (Polyimide) | | | | | |
| | A-3 (PBO precursor) | | | | | |
| | A-4 (Polysiloxane) | | | | | |
| | A-5 (Acrylic resin) | | | | | |
| | B-1 | | 8 | 6 | 4 | 2 |
| | B-2 | | 2 | 4 | 6 | 8 |
| | C-1 | | 5 | 5 | 5 | 5 |
| | C-2 | | | | | |
| | C-3 | | | | | |
| | C-4 | | | | | |
| | PGME | | 400 | 400 | 400 | 400 |
| | PGMEA | | | | | |
| | GBL | | 100 | 100 | 100 | 100 |
| Processing Conditions | Bleaching treatment after development | | With | With | With | With |
| | Heat treatment temperature [° C.] | | 400 | 400 | 400 | 400 |
| Evaluation results | Exposure sensitivity [mJ/cm$^2$] | | 190 | 190 | 200 | 210 |
| | $I_{(s)}/I_{(TOTAL)}$ | | 0.0020 | 0.0027 | 0.0036 | 0.0048 |
| | Organic EL display device reliability [hr] | | 500 | 450 | 400 | 400 |
| | Evaluation | | B+ | B | B− | B− |

TABLE 3

| | | Examples | | | | |
|---|---|---|---|---|---|---|
| | | 21 | 22 | 23 | 24 | 25 |
| Photosensitive resin composition | | U | V | W | X | Y |
| Composition of photosensitive resin composition [parts by mass] | A-1 (Polyimide precursor) | 100 | 100 | 100 | 100 | 100 |
| | A-2 (Polyimide) | | | | | |
| | A-3 (PBO precursor) | | | | | |
| | A-4 (Polysiloxane) | | | | | |
| | A-5 (Acrylic resin) | | | | | |
| | B-1 | | | 10 | 10 | 10 | 10 |
| | B-2 | | 10 | | | | |
| | C-1 | 5 | 5 | 5 | 5 | |
| | C-2 | | | | | |
| | C-3 | | | | | |
| | C-4 | | | | | |
| | PGME | 400 | 400 | 400 | 400 | 400 |
| | PGMEA | | | | | |
| | GBL | 100 | 100 | 100 | 100 | 100 |
| Processing Conditions | Bleaching treatment after development | With | Without | Without | Without | With |
| | Heat treatment temperature [° C.] | 400 | 270 | 300 | 350 | 400 |

TABLE 3-continued

|  |  | Examples | | | | |
| --- | --- | --- | --- | --- | --- | --- |
|  |  | 21 | 22 | 23 | 24 | 25 |
| Evaluation results | Exposure sensitivity [mJ/cm2] | 230 | 180 | 180 | 180 | 170 |
|  | $I_{(s)}/I_{(TOTAL)}$ | 0.0058 | 0.0028 | 0.0021 | 0.0015 | 0.0072 |
|  | Organic EL display device reliability [hr] | 350 | 400 | 500 | 600 | 300 |
|  | Evaluation | C | B− | B | A | D |

TABLE 4

|  |  | Comparative Examples | | | | | | |
| --- | --- | --- | --- | --- | --- | --- | --- | --- |
|  |  | 1 | 2 | 3 | 4 | 5 | 6 | 7 |
| Photosensitive resin composition |  | a | b | c | d | e | f | g |
| Composition of photosensitive resin composition [parts by mass] | A-1 (Polyimide precursor) | 100 | 100 | 100 | 100 | 100 | 100 | 100 |
|  | A-2 (Polyimide) |  |  |  |  |  |  |  |
|  | A-3 (PBO precursor) |  |  |  |  |  |  |  |
|  | A-4 (Polysiloxane) |  |  |  |  |  |  |  |
|  | A-5 (Acrylic resin) |  |  |  |  |  |  |  |
|  | B-1 | 10 | 10 |  |  |  |  | 10 |
|  | B-2 |  |  | 10 | 10 | 10 | 10 |  |
|  | C-1 |  |  |  |  | 5 | 5 | 5 |
|  | C-2 |  |  |  |  |  |  |  |
|  | C-3 |  |  |  |  |  |  |  |
|  | C-4 |  |  |  |  |  |  |  |
|  | C-5 |  |  |  |  |  |  |  |
|  | C-6 |  |  |  |  |  |  |  |
|  | C-7 |  |  |  |  |  |  |  |
|  | C-8 |  |  |  |  |  |  |  |
|  | C-9 |  |  |  |  |  |  |  |
|  | PGME | 400 | 400 | 400 | 400 | 400 | 400 | 400 |
|  | PGMEA |  |  |  |  |  |  |  |
|  | GBL | 100 | 100 | 100 | 100 | 100 | 100 | 100 |
| Processing Conditions | Bleaching treatment after development | With | With | With | With | With | With | With |
|  | Heat treatment temperature [° C.] | 270 | 350 | 270 | 400 | 270 | 350 | 180 |
| Evaluation results | Exposure sensitivity [mJ/cm$^2$] | 180 | 180 | 220 | 220 | 230 | 230 | 180 |
|  | $I_{(s)}/I_{(TOTAL)}$ | 0.0130 | 0.0102 | 0.0193 | 0.0105 | 0.0153 | 0.0116 | 0.0158 |
|  | Organic EL display device reliability [hr] | 200 | 200 | 150 | 200 | 150 | 200 | 150 |
|  | Evaluation | E | E | F | E | F | E | F |

TABLE 5

|  |  | Comparative Examples | | | | | | |
| --- | --- | --- | --- | --- | --- | --- | --- | --- |
|  |  | 8 | 9 | 10 | 11 | 12 | 13 | 14 |
| Photosensitive resin composition |  | h | i | j | k | l | m | n |
| Composition of photosensitive resin composition [parts by mass] | A-1 (Polyimide precursor) | 100 | 100 | 100 | 100 | 100 |  | 100 |
|  | A-2 (Polyimide) |  |  |  |  |  |  |  |
|  | A-3 (PBO precursor) |  |  |  |  |  | 100 |  |
|  | A-4 (Polysiloxane) |  |  |  |  |  |  |  |
|  | A-5 (Acrylic resin) |  |  |  |  |  |  |  |
|  | B-1 |  | 10 | 2 |  | 2.5 |  | 20 |
|  | B-2 |  |  | 8 | 4 | 2 | 2.5 | 20 |
|  | C-1 | 5 | 5 |  |  |  |  |  |
|  | C-2 |  |  |  |  |  |  |  |
|  | C-3 |  |  |  |  |  |  |  |
|  | C-4 |  |  |  |  |  |  |  |
|  | C-5 |  |  |  |  |  |  | 10 |
|  | C-6 |  |  |  |  |  |  | 2 |
|  | C-7 |  |  |  |  |  |  |  |
|  | C-8 |  |  |  |  |  |  |  |
|  | C-9 |  |  |  |  |  |  |  |

TABLE 5-continued

|  |  | Comparative Examples | | | | | | |
|---|---|---|---|---|---|---|---|---|
|  |  | 8 | 9 | 10 | 11 | 12 | 13 | 14 |
| Processing Conditions | PGME | 400 | 400 | 400 | 400 | 400 | 400 | 400 |
|  | PGMEA |  |  |  |  |  |  |  |
|  | GBL | 100 | 100 | 100 | 100 | 100 | 100 | 100 |
|  | Bleaching treatment after development | With | With | Without | Without | Without | Without | Without |
|  | Heat treatment temperature [° C.] | 200 | 350 | 250 | 250 | 200 | 320 | 160 |
| Evaluation results | Exposure sensitivity [mJ/cm²] | 180 | 200 | 700 | Not processable | 600 | 150 | 120 |
|  | $I_{(S)}/I_{(TOTAL)}$ | 0.0149 | 0.0095 | 0.0101 | Not evaluable | 0.0103 | 0.0215 | 0.0305 |
|  | Organic EL display device reliability [hr] | 150 | 200 | 200 | Not evaluable | 200 | 100 | 100 |
|  | Evaluation | F | E | E | G | E | F | F |

TABLE 6

|  |  | Comparative Examples | | | | | | |
|---|---|---|---|---|---|---|---|---|
|  |  | 15 | 16 | 17 | 18 | 19 | 20 | 21 |
| Photosensitive resin composition |  | o | p | q | r | s | t | u |
| Composition of photosensitive resin composition [parts by mass] | A-1 (Polyimide precursor) |  |  |  |  |  |  |  |
|  | A-2 (Polyimide) |  |  |  |  | 100 | 100 |  |
|  | A-3 (PBO precursor) | 100 | 100 |  |  |  |  |  |
|  | A-4 (Polysiloxane) |  |  | 100 | 100 |  |  |  |
|  | A-5 (Acrylic resin) |  |  |  |  |  |  | 100 |
|  | B-1 | 10 |  |  |  |  |  |  |
|  | B-2 |  | 20 | 6 | 6 | 10 | 10 | 15 |
|  | C-1 |  |  | 4 |  |  |  |  |
|  | C-2 |  |  |  |  |  | 0.5 | 5 |
|  | C-3 |  |  |  |  |  |  |  |
|  | C-4 | 5 |  |  |  |  |  |  |
|  | C-5 |  |  |  |  |  |  |  |
|  | C-6 |  |  |  |  |  |  |  |
|  | C-7 |  |  | 10 |  |  |  |  |
|  | C-8 |  |  |  | 0.5 |  |  |  |
|  | C-9 |  |  |  |  |  |  | 1 |
|  | PGME | 400 | 400 | 400 | 400 | 400 | 400 |  |
|  | PGMEA |  |  |  |  |  |  | 400 |
|  | GBL | 100 | 100 | 100 | 100 | 100 | 100 | 100 |
| Processing Conditions | Bleaching treatment after development | Without | Without | Without | With | Without | Without | Without |
|  | Heat treatment temperature [° C.] | 200 | 300 | 230 | 250 | 200 | 200 | 200 |
| Evaluation results | Exposure sensitivity [mJ/cm²] | 180 | 150 | 250 | 250 | 180 | 200 | 350 |
|  | $I_{(S)}/I_{(TOTAL)}$ | 0.0153 | 0.0278 | 0.0234 | 0.0210 | 0.0220 | 0.0185 | 0.0263 |
|  | Organic EL display device reliability [hr] | 150 | 100 | 200 | 200 | 200 | 200 | 100 |
|  | Evaluation | F | F | E | E | E | E | F |

DESCRIPTION OF REFERENCE SIGNS

1: Substrate
2: TFT
3: TFT insulation layer
4: Wiring line
5: Planarization layer
6: Contact hole
7: First electrode
8: Pixel defining layer
9: Organic EL layer
10: Second electrode
11: Glass substrate
12: First electrode
13: Auxiliary electrode
14: Pixel defining layer
15: Organic EL layer
16: Second electrode

The invention claimed is:

1. An organic EL display device comprising a cured product of a photosensitive resin composition containing an alkali-soluble resin (A) and a naphthoquinone diazide sulfonic acid ester compound (B),
wherein the cured product exhibits an intensity ratio $I_{(S)}/I_{(TOTAL)}$ of 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product.

2. The organic EL display device according to claim 1, wherein the organic EL display device includes at least a substrate, a first electrode, a second electrode, an organic EL layer, a planarization layer, and a pixel defining layer, and the cured product is included in the planarization layer and/or the pixel defining layer.

3. The organic EL display device according to claim 1, wherein the photosensitive resin composition further contains a base generator (C).

4. The organic EL display device according to claim 1, wherein the naphthoquinone diazide sulfonic acid ester compound (B) contains a naphthoquinone diazide-4-sulfonic acid ester compound (B1).

5. The organic EL display device according to claim 1, wherein the alkali-soluble resin (A) contains one or more kinds of alkali-soluble resins selected from the group consisting of polyimide, a polyimide precursor, polybenzoxazole, a polybenzoxazole precursor, a copolymer thereof, and polysiloxane.

6. The organic EL display device according to claim 4, wherein a content of the naphthoquinone diazide-4-sulfonic acid ester compound (B1) is 60% by mass or more and 100% by mass or less with respect to 100% by mass of a total amount of the naphthoquinone diazide sulfonic acid ester compound (B).

7. The organic EL display device according to claim 3, wherein the base generator (C) contains a guanidine derivative and/or a biguanide derivative.

8. A method for producing a cured product of a photosensitive resin composition containing an alkali-soluble resin (A) and a naphthoquinone diazide sulfonic acid ester compound (B), the method comprising the successive steps of:
applying the photosensitive resin composition to a substrate to form a photosensitive resin film;
drying the photosensitive resin film; exposing the dried photosensitive resin film;
developing the exposed photosensitive resin film; and heat-treating the developed photosensitive resin film to obtain a cured product,
wherein the cured product exhibits an intensity ratio $I_{(S)}/I_{(TOTAL)}$ of 0.0001 or more and 0.008 or less, where $I_{(S)}$ (unit: counts) is a negative secondary ion intensity of sulfur, and $I_{(TOTAL)}$ (unit: counts) is a sum total of negative secondary ion intensities of carbon, oxygen, fluorine, silicon and sulfur obtained by time-of-flight secondary ion mass spectrometry of the cured product.

9. The method for producing a cured product according to claim 8, wherein a maximum heating temperature in the step of obtaining a cured product by the heat treatment is 240° C. or more and 420° C. or less.

10. The method for producing a cured product according to claim 8, further comprising a step of irradiating the developed photosensitive resin film with ultraviolet rays between the step of developing the exposed photosensitive resin film and the step of heat-treating the developed photosensitive resin film to obtain the cured product.

11. A method for producing an organic EL display device comprising a step of forming a planarization layer, a first electrode, a pixel defining layer, an organic EL layer, and a second electrode in this order on a substrate, wherein the method for producing a cured product contained in the planarization layer and/or the pixel defining layer includes a step of forming the cured product by the method according to claim 8.

* * * * *